United States Patent
Choi et al.

(10) Patent No.: US 12,062,668 B2
(45) Date of Patent: Aug. 13, 2024

(54) CRYSTALLIZATION PROCESS OF OXIDE SEMICONDUCTOR, AND METHOD OF MANUFACTURING THIN FILM TRANSISTOR, A THIN FILM TRANSISTOR, A DISPLAY PANEL, AND AN ELECTRONIC DEVICE

(71) Applicant: ADRC. CO. KR, Seoul (KR)

(72) Inventors: Soon Ho Choi, Yongin-si (KR); Chae Yeon Hwang, Seoul (KR); Hyo Min Kim, Seoul (KR)

(73) Assignee: ADRC. CO. KR, Seoul (KR)

( * ) Notice: Subject to any disclaimer, the term of this patent is extended or adjusted under 35 U.S.C. 154(b) by 436 days.

(21) Appl. No.: 17/534,656

(22) Filed: Nov. 24, 2021

(65) Prior Publication Data
US 2022/0208805 A1 Jun. 30, 2022

(30) Foreign Application Priority Data
Dec. 29, 2020 (KR) .................. 10-2020-0186259

(51) Int. Cl.
*H01L 27/12* (2006.01)
*H01L 21/02* (2006.01)
(Continued)

(52) U.S. Cl.
CPC .... *H01L 27/1274* (2013.01); *H01L 21/02565* (2013.01); *H01L 21/02592* (2013.01);
(Continued)

(58) Field of Classification Search
CPC ............. H01L 27/1274; H01L 27/1225; H01L 27/1285; H01L 27/1277; H01L 29/66969;
(Continued)

(56) References Cited

U.S. PATENT DOCUMENTS 8,703,531 B2   4/2014 Honda et al.
2009/0152506 A1*  6/2009 Umeda .................. C30B 1/02
                                                252/500

(Continued)

FOREIGN PATENT DOCUMENTS

KR   10-2012-0079724   7/2012
KR   10-2013-0045252   5/2013
(Continued)

OTHER PUBLICATIONS

Purnomo Sidi Priambodo, "Theoretical analysis, design, fabrication and characterization of dielectric and nonlinear guided-mode resonance optical filters", Ph.D. Dissertation, The University of Texas at Arlington, pp. 112, Oct. 2003 (Year: 2003).*

(Continued)

*Primary Examiner* — Sitaramarao S Yechuri
(74) *Attorney, Agent, or Firm* — LEX IP MEISTER, PLLC

(57) ABSTRACT

Disclosed are a crystallization process of an oxide semiconductor, a method of manufacturing a thin film transistor including the same, a thin film transistor, a display panel, and an electronic device. The crystallization process of an oxide semiconductor includes forming an amorphous oxide semiconductor layer on a substrate, forming a crystallization auxiliary layer including a light absorbing inorganic material on the amorphous oxide semiconductor layer, and annealing the crystallization auxiliary layer to crystallize the amorphous oxide semiconductor layer.

20 Claims, 24 Drawing Sheets

(51) Int. Cl.
*H01L 29/66* (2006.01)
*H01L 29/786* (2006.01)

(52) U.S. Cl.
CPC .... *H01L 21/02686* (2013.01); *H01L 27/1225* (2013.01); *H01L 29/66969* (2013.01); *H01L 29/7869* (2013.01)

(58) Field of Classification Search
CPC .......... H01L 29/7869; H01L 21/02565; H01L 21/02592; H01L 21/02686; H01L 21/02488; H01L 21/02554; H01L 21/02667; H01L 21/02675; H01L 21/02672; H01L 21/02691

See application file for complete search history.

(56) References Cited

U.S. PATENT DOCUMENTS

2011/0217815 A1   9/2011   Honda et al.
2013/0288426 A1*  10/2013  Akimoto ........... H01L 29/66765
                                                    438/104
2016/0233249 A1*  8/2016   Lu ..................... H01L 29/66757
2020/0006396 A1*  1/2020   Sugawara ......... H01L 29/78693

FOREIGN PATENT DOCUMENTS

KR   10-2013-0070971   6/2013
KR   10-2014-0142193   12/2014

OTHER PUBLICATIONS

Ya-Hui Yang et al., "Characteristic Enhancement of Solution-Processed In—Ga—Zn Oxide Thin-Film Transistors by Laser Annealing", IEEE Electron Device Letters, vol. 31, No. 9, Sep. 2010.

Do-Hoon Kim et al., "Effects of Rapid Thermal Annealing on the Conduction of a-IGZO Films", Journal of the Korean Institute of Electrical and Electronic Material Engineers 29(1):11-16, Jan. 2016.

* cited by examiner

CRYSTALLIZATION PROCESS OF OXIDE SEMICONDUCTOR, AND METHOD OF MANUFACTURING THIN FILM TRANSISTOR, A THIN FILM TRANSISTOR, A DISPLAY PANEL, AND AN ELECTRONIC DEVICE

CROSS-REFERENCE TO RELATED APPLICATION

This application claims priority to and the benefit of Korean Patent Application No. 10-2020-0186259 filed in the Korean Intellectual Property Office on Dec. 29, 2020, the entire contents of which are incorporated herein by reference.

BACKGROUND OF THE INVENTION

(a) Field of the Invention

A crystallization process of an oxide semiconductor, a method of manufacturing a thin film transistor, a thin film transistor, a display panel, and an electronic device are disclosed.

(b) Description of the Related Art

A display device such as a liquid crystal display (LCD) or an organic light emitting diode display (OLED display) includes a thin film transistor (TFT) that is a three-terminal element as a switching device and/or a driving device. Recently, as such a thin film transistor, a thin film transistor including an oxide semiconductor has been studied. However, oxide semiconductors are mostly included in an amorphous state, and in this case, there is a limit to improving electrical properties and stability thereof.

SUMMARY OF THE INVENTION

An embodiment provides a crystallization process of an oxide semiconductor that may effectively crystallize the oxide semiconductor.

Another embodiment provides a method of manufacturing a thin film transistor including the crystallization process of the oxide semiconductor.

Another embodiment provides a thin film transistor including the crystalline oxide semiconductor obtained by the above process.

Another embodiment provides a display panel including the thin film transistor.

Another embodiment provides an electronic device including the thin film transistor or a display panel.

According to an embodiment, a crystallization process of an oxide semiconductor includes forming an amorphous oxide semiconductor layer on a substrate, forming a crystallization auxiliary layer including a light absorbing inorganic material on the amorphous oxide semiconductor layer, and annealing the crystallization auxiliary layer to crystallize the amorphous oxide semiconductor layer.

The light absorbing inorganic material may include amorphous silicon.

The annealing of the crystallization auxiliary layer may include irradiating light.

In the irradiating of the light, a light source irradiating light having a wavelength of less than about 500 nm may be used.

The annealing of the crystallization auxiliary layer may be performed by laser annealing or heat treatment.

The annealing of the crystallization auxiliary layer may be performed by laser annealing, and the laser annealing may be blue diode laser annealing or excimer laser annealing.

The laser annealing may be performed for about 5 μs or less.

The laser annealing may be performed with an output of about 5 W to about 15 W.

In the annealing of the crystallization auxiliary layer, the highest surface temperature of the crystallization auxiliary layer may be about 500° C. to about 1800° C.

A thickness of the crystallization auxiliary layer may be about 10 nm to about 500 nm, and a thickness of the amorphous oxide semiconductor layer may be about 20 nm to about 200 nm.

The thickness of the crystallization auxiliary layer may be about 0.5 times to about 10 times the thickness of the amorphous oxide semiconductor layer.

The method may further include annealing at a temperature of about 300° C. to about 600° C. in an oxygen atmosphere after the crystallization of the amorphous oxide semiconductor layer.

The method may further include forming a capping layer between the forming of the amorphous oxide semiconductor layer and the forming of the crystallization auxiliary layer.

The capping layer may include an oxide, a nitride, an oxynitride, or a combination thereof including silicon, aluminum, or a combination thereof.

The method may further include removing the crystallization auxiliary layer after the crystallization of the amorphous oxide semiconductor layer.

A crystallized oxide semiconductor layer having a (009) diffraction peak in the XRD spectrum may be obtained by the annealing of the crystallization auxiliary layer.

According to another embodiment, a crystalline oxide semiconductor formed by the aforementioned method and exhibiting a (009) diffraction peak in an XRD spectrum is provided.

According to another embodiment, a thin film transistor includes the crystalline oxide semiconductor layer, a gate electrode, the gate electrode being at least partially overlapped with the crystalline oxide semiconductor layer, and a source electrode and a drain electrode electrically connected to the crystalline oxide semiconductor layer, wherein the crystalline oxide semiconductor layer exhibits a (009) diffraction peak in an XRD spectrum.

According to another embodiment, a method of manufacturing a thin film transistor includes crystallizing an oxide semiconductor by the above process to form a crystalline oxide semiconductor layer, forming a gate electrode at least partially overlapped with the crystalline oxide semiconductor layer, and forming a source electrode and a drain electrode electrically connected to the crystalline oxide semiconductor layer.

According to another embodiment, a display panel including the thin film transistor is provided.

According to another embodiment, an electronic device including the thin film transistor is provided.

The oxide semiconductor may be effectively crystallized to improve the electrical characteristics of the thin film transistor including the oxide semiconductor.

DETAILED DESCRIPTION OF THE EMBODIMENTS

Figure 1:
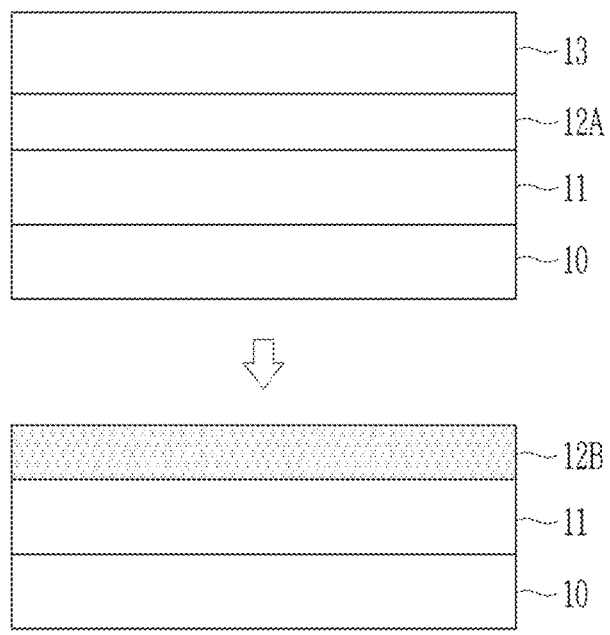
FIG. 1 is a cross-sectional view schematically showing a crystallization process of an oxide semiconductor according to an embodiment.

Hereinafter, example embodiments of the present disclosure will be described in detail so that a person skilled in the art would understand the same. This disclosure may, however, be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, "combination" includes a mixture or a stacked structure of two or more.

Hereinafter, a crystallization process of an oxide semiconductor according to an embodiment is provided with reference to the drawings.

FIG. 1 is a cross-sectional view schematically showing an example of a crystallization process of an oxide semiconductor according to an embodiment.

A crystallization process of an oxide semiconductor according to an embodiment includes forming a buffer layer 11 on a substrate 10, forming an amorphous oxide semiconductor layer 12A, forming a crystallization auxiliary layer 13, and annealing the crystallization auxiliary layer 13 to crystallize the amorphous oxide semiconductor layer 12A.

The substrate 10 may be a support substrate, for example, a glass plate, a metal plate, a polymer substrate, or a silicon wafer. As an example, the substrate 10 may be a glass plate or a polymer substrate, and the polymer substrate may include, for example, polyethylene terephthalate, polyethylene naphthalate, polycarbonate, polyacrylate, polymethyl methacrylate, polyimide, polyamide, polyamideimide, a copolymer thereof, or a combination thereof, but the present disclosure is not limited thereto.

The buffer layer 11 may include, for example, an organic material, an inorganic material, and/or an organic-inorganic material, and may include, for example, an oxide, a nitride, or an oxynitride. The buffer layer 11 may include, for example, a silicon oxide, a silicon nitride, a silicon oxynitride, or a combination thereof, but is not limited thereto. The buffer layer 11 may be one layer or two or more layers, and may cover the whole surface of the substrate 10.

The forming of the buffer layer 11 may be performed by, for example, a vapor deposition process or a solution process of an organic material, an inorganic material, and/or an organic-inorganic material on the substrate 10. The vapor deposition process may include, for example, physical vapor deposition (PVD) such as sputtering, chemical vapor deposition (CVD), atomic layer deposition (ALD), or a combination thereof, and the solution processes may include, for example, spin coating, slit coating, ink jet processes, spraying, or a combination thereof.

The buffer layer 11 may have a thickness of, for example, about 30 nm to about 1 μm, and within the above range, about 50 nm to about 800 nm or about 100 nm to about 800 nm.

The amorphous oxide semiconductor layer 12A may be formed on the buffer layer 11.

The amorphous oxide semiconductor layer 12A may include an oxide semiconductor including metal, semi-metal, or a combination thereof, and may include, for example, an amorphous oxide semiconductor including indium (In), gallium (Ga), zinc (Zn), tin (Sn), or a combination thereof. The amorphous oxide semiconductor layer 12A may include, for example, an amorphous indium-gallium oxide layer, an amorphous indium-zinc oxide layer, an amorphous zinc-tin oxide layer, an amorphous indium-gallium-zinc oxide layer, an amorphous indium-gallium-tin oxide layer, an amorphous indium-tin-zinc oxide layer, or a combination thereof, but is not limited thereto.

For example, the indium-gallium oxide layer may be an oxide semiconductor layer made of indium (In) and gallium (Ga) as metal elements.

For example, the indium-gallium oxide layer may include indium (In) and gallium (Ga) as main components of metal elements, and may further include at least one other element (e.g., a metal or semi-metal) except indium (In) and gallium (Ga) as a dopant.

For example, the indium-zinc oxide layer may be an oxide semiconductor layer made of indium (In) and zinc (Zn) as metal elements.

For example, the indium-zinc oxide layer may include indium (In) and zinc (Zn) as main components of the metal elements, and may further include one or more other elements (e.g., a metal or semi-metal) except indium (In) and zinc (Zn) as a dopant.

For example, the zinc-tin oxide layer may be an oxide semiconductor layer made of indium (In) and tin (Sn) as metal elements.

For example, the zinc-tin oxide layer may include indium (In) and tin (Sn) as main components of the metal elements, and may further include one or more other elements (e.g., a metal or semi-metal) except indium (In) and tin (Sn) as a dopant.

For example, the indium-gallium-zinc oxide layer may be an oxide semiconductor layer made of indium (In), gallium (Ga), and zinc (Zn) as metal elements.

For example, the indium-gallium-zinc oxide layer may include indium (In), gallium (Ga), and zinc (Zn) as main components of the metal elements, and may further include one or more other elements (e.g., a metal or semi-metal) except indium (In), gallium (Ga), and zinc (Zn) as a dopant.

For example, the indium-gallium-tin oxide layer may be an oxide semiconductor layer made of indium (In), gallium (Ga), and tin (Sn) as metal elements.

For example, the indium-gallium-tin oxide layer may include indium (In), gallium (Ga) and tin (Sn) as main components of the metal elements, and may further include one or more other elements (e.g., a metal or semi-metal) except indium (In), gallium (Ga), and tin (Sn) as dopants.

For example, the indium-tin-zinc oxide layer may be an oxide semiconductor layer made of indium (In), tin (Sn), and zinc (Zn) as metal elements.

For example, the indium-tin-zinc oxide layer may include indium (In), tin (Sn), and zinc (Zn) as main components of the metal elements, and may further include one or more other elements (e.g., a metal or semi-metal) except indium (In), tin (Sn), and zinc (Zn) as a dopant.

The forming of the amorphous oxide semiconductor layer 12A may be performed by, for example, a vapor deposition process or a solution process. The vapor deposition processes may include physical vapor deposition (PVD) such as sputtering, chemical vapor deposition (CVD), atomic layer deposition (ALD), or a combination thereof, and the solution processes may include, for example, spin coating, slit coating, ink jet processes, spraying, or a combination thereof.

The amorphous oxide semiconductor layer 12A may have a thickness of, for example, about 20 nm to about 200 nm, and within the above range, about 20 nm to about 180 nm, about 25 nm to about 150 nm, or about 25 nm to about 100 nm.

The crystallization auxiliary layer 13 may be formed on the amorphous oxide semiconductor layer 12A and may cover, for example, the whole surface of the amorphous oxide semiconductor layer 12A. The crystallization auxiliary layer 13 is an auxiliary layer for crystalizing the amorphous oxide semiconductor layer 12A and may effectively supply and transfer thermal energy required for crystallization of the amorphous oxide semiconductor layer 12A.

The crystallization auxiliary layer 13 may include a light absorption inorganic material. The light absorption inorganic material has no particular limit but may include any inorganic material configured to absorb light at a predetermined wavelength (or light of a predetermined wavelength spectrum) and thus convert the absorbed light into thermal energy, for example, an inorganic material configured to absorb light at a wavelength belonging to at least one among a light ultraviolet (UV) wavelength spectrum, a visible wavelength spectrum, and an infrared (IR) wavelength spectrum. The light absorption inorganic material may have an absorption wavelength (or a maximum absorption wavelength of an absorption spectrum) including, for example, at least a portion of a wavelength region of less than about 500 nm, and within the above range, greater than or equal to about 100 nm and less than 500 nm, or about 120 nm to about 480 nm.

This light absorption inorganic material may be, for example, an amorphous light absorption inorganic material, for example, a material having a relatively small energy bandgap of about 1.1 eV to about 2.0 eV, and for example, may include amorphous silicon (a-Si).

The forming of the crystallization auxiliary layer 13 may be performed by using the aforementioned light absorption inorganic material, for example, in a vapor deposition process such as physical vapor deposition (PVD) such as sputtering, chemical vapor deposition (CVD), atomic layer deposition (ALD), or a combination thereof.

The crystallization auxiliary layer 13 may have a thickness of about 10 nm to about 500 nm, and within the above range, about 10 nm to about 400 nm, about 10 nm to about 300 nm, about 10 nm to about 200 nm, about 20 nm to about 400 nm, about 20 nm to about 300 nm, about 20 nm to about 200 nm, about 30 nm to about 400 nm, about 30 nm to about 300 nm, or about 10 nm to about 200 nm. The thickness of the crystallization auxiliary layer 13 may be larger or smaller than the thickness of the amorphous oxide semiconductor layer 12A, and for example, about 0.5 times to about 10 times larger than that of the amorphous oxide semiconductor layer 12A.

After the forming of the crystallization auxiliary layer 13, a dehydrogenation process of the crystallization auxiliary layer 13 may be additionally performed. The dehydrogenation process is to remove hydrogen atoms at the surface of and/or inside the crystallization auxiliary layer 13, and for example, may be performed under a nitrogen atmosphere.

The annealing of the crystallization auxiliary layer 13 may be, for example, performed by laser annealing or heat treatment. The heat treatment may, for example, include a method of using a heat-treatment apparatus such as a hot plate and a furnace or rapid thermal annealing of rapidly increasing a temperature and cooling down in a short time.

For example, the annealing of the crystallization auxiliary layer 13 may include irradiating light to the crystallization auxiliary layer 13, wherein the irradiating, for example, may be performed by using a light source irradiating light in a relatively short wavelength region of less than about 500 nm. The light source may be, for example, an ultraviolet (UV) light source or a blue light source, for example, an excimer laser irradiating light of a wavelength of greater than or equal to about 100 nm and less than about 360 nm or a blue laser irradiating light of a wavelength of about 360 nm to about 480 nm. Since the aforementioned amorphous oxide semiconductor layer 12A is very transparent and does not substantially absorb light in a short wavelength region, the crystallization auxiliary layer 13 disposed on the amorphous oxide semiconductor layer 12A may be configured to absorb the light of a short wavelength region and thus transfer thermal energy generated therefrom into the amorphous oxide semiconductor layer 12A.

The laser annealing may be, for example, excimer laser annealing that irradiates light of a UV wavelength with an excimer laser on the crystallization auxiliary layer 13 or blue diode laser annealing that irradiates a blue diode laser on the crystallization auxiliary layer 13.

The laser annealing may be performed through several scans with a relatively high output for a very short time or with a relatively low output. For example, the laser annealing may be performed for about 50 μs to about 100 ms with an output of greater than or equal to about 5 W, greater than or equal to about 7 W, greater than or equal to about 8 W, greater than or equal to about 9 W, greater than or equal to about 10 W, about 5 W to about 20 W, about 5 W to about 15 W, about 5 W to about 13 W, about 5 W to about 11.44 W, about 7 W to about 20 W, about 7 W to about 15 W, about 7 W to about 13 W, about 7 W to about 11.44 W, about 8 W to about 20 W, about 8 W to about 15 W, about 8 W to about 13 W, about 8 W to about 11.44 W, about 9 W to about 20 W, about 9 W to about 15 W, about 9 W to about 13 W, about 9 W to about 11.44 W, about 10 W to about 20 W, about 10 W to about 15 W, about 10 W to about 13 W, or about 10 W to about 11.44 W. The laser annealing may be performed through one or more scan, for example, scanning of about 1 shot to about 15 shots, about 1 shot to about 10 shots, or about 1 shot to about 5 shots.

By the annealing of the crystallization auxiliary layer 13, the crystallization auxiliary layer 13 may be rapidly heated up to a high temperature and cooled it down, and this rapid temperature change may change a state of materials forming the crystallization auxiliary layer 13 and/or the amorphous oxide semiconductor layer 12A. For example, the crystallization auxiliary layer 13 and/or the amorphous oxide semiconductor layer 12A before annealing is in an amorphous state and may be changed to a fusion state through a crystallization state as the temperature is rapidly increased. The state and the change rate of the crystallization auxiliary layer 13 and/or the amorphous oxide semiconductor layer 12A may be determined by an annealing time, an annealing temperature, and/or an output of a light source.

For example, in the annealing of the crystallization auxiliary layer 13, the crystallization auxiliary layer 13 may have a maximum surface temperature of greater than or equal to about 500° C., greater than or equal to about 600° C., greater than or equal to about 800° C., greater than or equal to about 1000° C., or greater than or equal to about 1200° C., and for example, about 500° C. to about 1800° C., about 600° C. to about 1800° C., about 800° C. to about 1800° C., about 1000° C. to about 1800° C., or about 1200° C. to about 1800° C. The crystallization auxiliary layer 13 may be in the crystallization state, a partial fusion state, or a complete fusion state at the maximum surface temperature.

In this way, as the temperature of the crystallization auxiliary layer 13 and the amorphous oxide semiconductor layer 12A under the crystallization auxiliary layer 13 is increased through this annealing, the amorphous oxide semiconductor layer 12A is crystallized and thus formed into a crystalline oxide semiconductor layer 12B. The whole surface of the amorphous oxide semiconductor layer 12A is covered with the crystalline auxiliary layer 13, achieving uniform crystallization over the whole surface. The crystalline oxide semiconductor layer 12B may be, for example, a crystalline indium-gallium oxide layer, a crystalline indium-zinc oxide layer, a crystalline zinc-tin oxide layer, a crystalline indium-gallium-zinc oxide layer, a crystalline indium-gallium-tin oxide layer, a crystalline indium-tin-zinc oxide layer, or a combination thereof.

Crystallinity of the crystalline oxide semiconductor layer 12B may be determined by an annealing time, an annealing temperature, an output of a light source, the number of laser scans, a thickness of the crystallization auxiliary layer 13, and/or the like, and for example, as the annealing time is longer, the annealing temperature is higher, the output of the light source is higher, the number of laser scans is larger, and the thickness of the crystallization auxiliary layer 13 is thicker, the crystallinity of the crystalline oxide semiconductor layer 12B may be higher. For example, the crystallinity of the crystalline oxide semiconductor layer 12B may be substantially uniform along a thickness direction of the crystalline oxide semiconductor layer 12B.

The crystalline oxide semiconductor layer 12B crystallized using the crystallization auxiliary layer 13, unlike an oxide semiconductor crystallized by using a different crystallization process, may exhibit a characteristic diffraction peak in an X-ray diffraction (XRD) spectrum, for example, a (009) diffraction peak (2θ=around about 31° (a specific point between about 30° to about 33°)). The (009) diffraction peak indicates crystal planes arranged along a c-axis, and at least a portion of the crystalline oxide semiconductor layer 12B may have the crystal planes arranged along a c-axis. Accordingly, the crystalline oxide semiconductor layer 12B may exhibit high charge mobility.

After forming the crystalline oxide semiconductor layer 12B, the crystallization auxiliary layer 13 may be removed. The removal of the crystallization auxiliary layer 13 may be, for example, performed by dry etching or wet etching, but is not limited thereto.

The crystalline oxide semiconductor layer 12B may be additionally annealed under an oxygen atmosphere, for example, at about 300° C. to about 600° C.

According to the crystallization process of an oxide semiconductor according to the embodiment, the crystallization auxiliary layer 13 including a light absorbing inorganic material such as amorphous silicon is used to effectively crystallize the amorphous oxide semiconductor layer 12A for a very short time and thus form the crystalline oxide semiconductor layer 12B. Accordingly, unlike a conventional process of crystallizing an amorphous oxide semiconductor by exposing it at a high temperature of greater than or equal to about 800° C. or greater than or equal to about 1000° C. for a long time, this crystallization process of the embodiment is performed by rapidly cooling down after rapidly increasing a temperature in a very short time (several to tens of μs) while light is irradiated, which needs no separate high temperature heat treatment equipment. In addition, since an amorphous oxide semiconductor layer 12A even with a large area may be formed into a uniform crystalline oxide semiconductor layer 12B in a short time, this process may be effective for low cost and large area crystallization.

Hereinafter, another example of the crystallization process of an oxide semiconductor according to an embodiment is illustrated with reference to a drawing.

Figure 2:
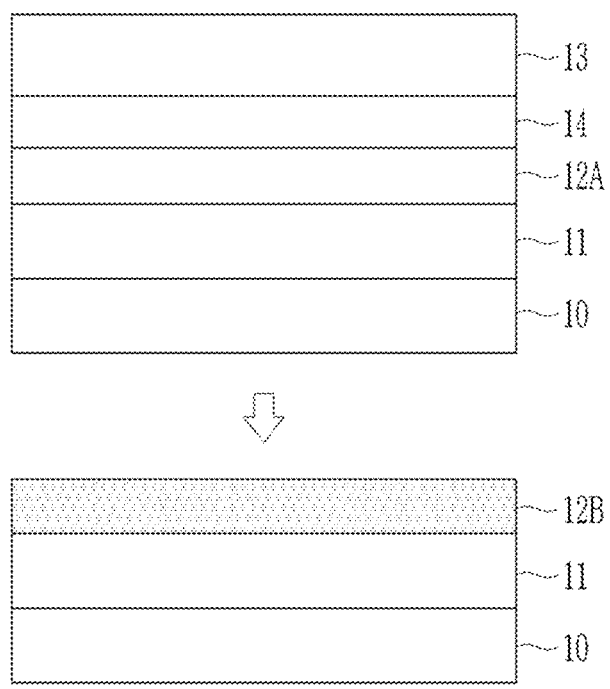
FIG. 2 is a cross-sectional view schematically showing a crystallization process of an oxide semiconductor according to another embodiment.

FIG. 2 is a cross-sectional view schematically showing the crystallization process of an oxide semiconductor according to another embodiment.

The crystallization process of an oxide semiconductor according to the embodiment, like the aforementioned embodiment, includes forming a buffer layer 11 on a substrate 10, forming an amorphous oxide semiconductor layer 12A, forming a crystallization auxiliary layer 13, and annealing the crystallization auxiliary layer 13 to crystallize the amorphous oxide semiconductor layer 12A.

However, the crystallization process of an oxide semiconductor according to the embodiment, unlike the aforementioned embodiment, may further include forming a capping layer 14 between the forming of the amorphous oxide semiconductor layer 12A and the forming of the crystallization auxiliary layer 13.

The capping layer 14 may prevent the amorphous oxide semiconductor layer 12A directly exposed to light in irradiating the light to the crystallization auxiliary layer 13 and block a reaction between the crystallization auxiliary layer 13 and the amorphous oxide semiconductor layer 12A and thus prevent modification of characteristics of a material, and simultaneously, locally non-uniform heat transfer from the crystallization auxiliary layer 13 into the amorphous oxide semiconductor layer 12A, so that the crystalline oxide semiconductor layer 12B may have relatively uniform grains.

The capping layer 14 may include, for example, an insulating material, for example, an oxide, a nitride, an oxynitride, or a combination thereof, for example, an oxide, a nitride, an oxynitride, or a combination thereof, which includes silicon, aluminum, or a combination thereof, but is not limited thereto. For example, the capping layer 14 may include a silicon oxide.

The capping layer 14 may have a thickness of, for example, about 10 nm to about 200 nm, and within the above range, about 30 nm to about 150 nm, or about 30 nm to about 120 nm.

For example, when the capping layer 14 is included, compared with when the amorphous oxide semiconductor layer 12A is used alone, a thickness of the amorphous oxide semiconductor layer 12A may be reduced, for example, in a range of about 20 nm to about 100 nm.

The capping layer 14 may be removed or left after forming the crystalline oxide semiconductor layer 12B. When the capping layer 14 is left, the capping layer 14 may be used as a protective layer of the crystalline oxide semiconductor layer 12B or as a gate insulating layer of a thin film transistor 100, which is described later.

Hereinafter, an example the crystallization process of an oxide semiconductor according to another embodiment is illustrated.

The crystallization process of an oxide semiconductor according to another embodiment includes forming the buffer layer 11 on the substrate 10, forming the amorphous oxide semiconductor layer 12A, and annealing the amorphous oxide semiconductor layer 12A to crystallize the amorphous oxide semiconductor layer 12A.

The forming the buffer layer 11 and the forming the amorphous oxide semiconductor layer 12A are the same as above. For example, the forming the amorphous oxide semiconductor layer 12A may be performed through a solution process, for example, a process of spraying a precursor solution for an amorphous oxide semiconductor and then heat-treating it. The spraying may be performed once to 50 times, for example, and spray pyrolysis may be performed by heat-treating at a temperature of about 300° C. to about 500° C.

The annealing the amorphous oxide semiconductor layer 12A may be performed in a thermal crystallization method, for example, by using a heating apparatus such as a hot plate or a furnace or a rapid thermal annealing (RTA) method.

For example, the method of using a heating apparatus may be heat treatment performed by putting the substrate 10 having the buffer layer 11 and the amorphous oxide semiconductor layer 12A in the heating apparatus such as a hot plate or a furnace and heat-treating it at about 600° C. to about 700° C., and within the range, about 650° C. to about 700° C. for about 1 minute to about 150 minutes, about 1 minute to about 120 minutes, about 1 minute to about 90 minutes, about 1 minute to about 60 minutes, or about 1 minute to about 30 minutes. The heat-treating may be performed under a nitrogen atmosphere, an oxygen atmosphere, or air.

For example, since the rapid thermal annealing (RTA) is performed by rapidly increasing a temperature and then rapidly cooling it down, the substrate 10 may be annealed in a short time without difficulties. The rapid thermal annealing (RTA) may have a very high temperature increasing rate and a high cooling rate, for example, about 350° C./min to about 600° C./min, and within the range, about 400° C./min to about 550° C./min, about 420° C./min to about 500° C./min, or about 450° C./min. The annealing temperature of the rapid thermal annealing may be, for example, about 700° C. to about 1000° C., and desirably about 800° C. to about 1000° C. for about 1 minute to about 30 minutes. If the annealing temperature is increased, the annealing time may be shortened, while if the annealing temperature is decreased, the annealing time may be increased. The rapid thermal annealing may be, for example, performed in a nitrogen atmosphere.

Through this heat treatment, this amorphous oxide semiconductor layer 12A may be crystallized and converted into the crystalline oxide semiconductor layer 12B. As described above, the crystalline oxide semiconductor layer 12B may be, for example, a crystalline indium-gallium oxide layer, a crystalline indium-zinc oxide layer, a crystalline zinc-tin oxide layer, a crystalline indium-gallium-zinc oxide layer, a crystalline indium-gallium-tin oxide layer, a crystalline indium-tin-zinc oxide layer, or a combination thereof. The crystalline oxide semiconductor layer 12B may be additionally annealed under an oxygen atmosphere, for example, at a temperature of about 300° C. to about 600° C.

The crystalline oxide semiconductor layer 12B, like the aforementioned embodiment, may exhibit a characteristic diffraction peak in the X ray spectral diffraction (XRD) spectrum, for example, a (009) diffraction peak (2θ is about) 31°. The (009) diffraction peak indicates crystal planes arranged along a c-axis, and at least a portion of the crystalline oxide semiconductor layer 12B may have the crystal planes arranged along a c-axis. Accordingly, the crystalline oxide semiconductor layer 12B may exhibit high charge mobility.

When the amorphous oxide semiconductor layer 12A is crystallized according to the present embodiment, the presence or absence of the c-axis oriented crystal planes may be determined according to a thickness of the amorphous oxide semiconductor layer 12A. For example, when the amorphous oxide semiconductor layer 12A may have a thickness of about 50 nm to about 200 nm, and within the range, about 50 nm to about 100 nm, or about 70 nm to about 100 nm, the c-axis oriented crystal planes ((009) diffraction peak) may be found.

The aforementioned crystallization process of the oxide semiconductor may be effectively used as a method of manufacturing an oxide thin film transistor including an oxide semiconductor as an active layer of a thin film transistor.

Figure 3:
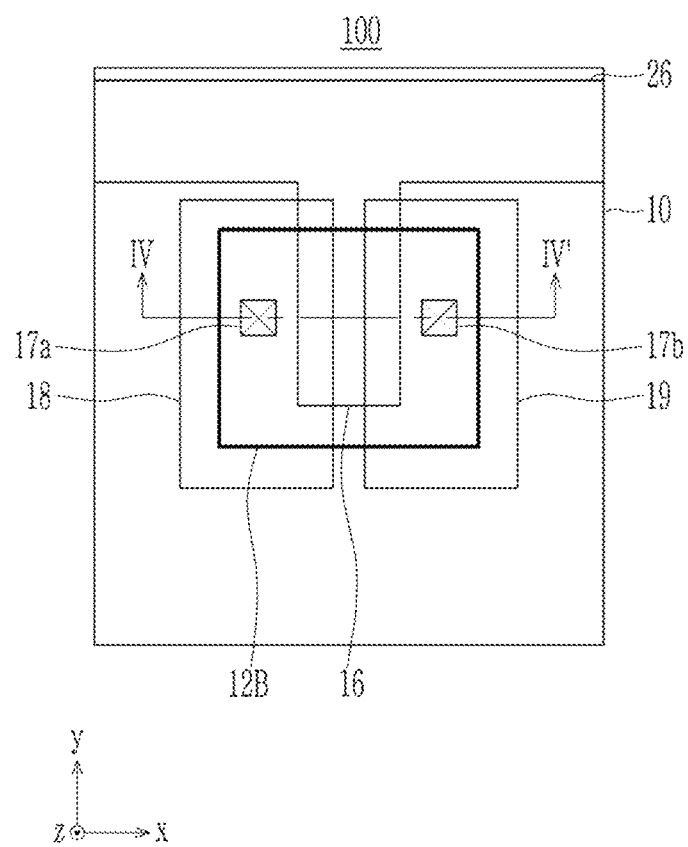
FIG. 3 is a schematic plan view of a thin film transistor according to an embodiment.
Figure 4:
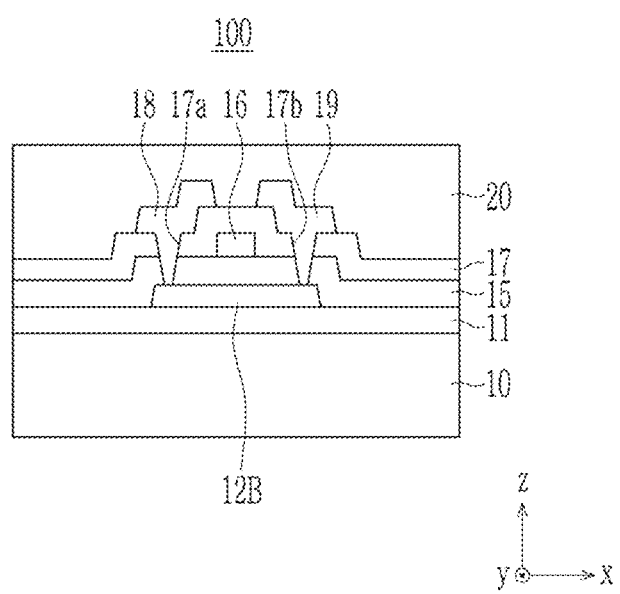
FIG. 4 is a cross-sectional view of the thin film transistor of FIG. 3 taken along line IV-IV.

FIG. 3 is a schematic plan view of a thin film transistor according to an embodiment, and FIG. 4 is a cross-sectional view of the thin film transistor of FIG. 3 taken along line IV-IV'.

The thin film transistor 100 according to an embodiment includes the substrate 10, the buffer layer 11, the crystalline oxide semiconductor layer 12B, the gate insulating layer 15, the gate electrode 16, the interlayer insulating film 17, the source electrode 18, the drain electrode 19, and the passivation layer 20.

The substrate 10 and the buffer layer 11 are the same as described above.

The crystalline oxide semiconductor layer 12B may be an active layer and include a channel region of the thin film transistor 100. The crystalline oxide semiconductor layer 12B may be a layer formed from the amorphous oxide semiconductor layer 12A through the above crystallization process, and as described above, exhibit a (009) diffraction peak (2θ is around about 31°) in the XRD spectrum and accordingly, have c-axis oriented crystal planes.

The crystalline oxide semiconductor layer 12B may include, for example, a crystalline oxide semiconductor including at least one metal and/or semi-metal, for example, a crystalline oxide semiconductor including at least one selected from indium (In), gallium (Ga), zinc (Zn), and tin (Sn). The crystalline oxide semiconductor layer 12B may be, for example, a crystalline indium-gallium oxide layer, a crystalline indium-zinc oxide layer, a crystalline zinc-tin oxide layer, a crystalline indium-gallium-zinc oxide layer, a crystalline indium-gallium-tin oxide layer, a crystalline indium-tin-zinc oxide layer, or a combination thereof, but is not limited thereto.

The crystalline oxide semiconductor layer 12B may have a thickness of, for example, about 20 nm to about 200 nm, and within the above range, about 20 nm to about 180 nm, about 25 nm to about 150 nm, or about 25 nm to about 100 nm.

The gate electrode 16 may be at least partially overlapped with the crystalline oxide semiconductor layer 12B. The gate electrode 16 is electrically connected to a gate line 26 transmitting a gate signal. The gate electrode 16 may be made of, for example, gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 10 is a silicon wafer, the gate electrode 16 may be a doped region of the silicon wafer. The gate electrode 16 may have one or two or more layers.

The gate insulating layer 15 may be disposed between the crystalline oxide semiconductor layer 12B and the gate electrode 16, and may cover the whole surface of the substrate 10. The gate insulating layer 15 may include an organic material, an inorganic material, and/or an organic-inorganic material, and for example, an oxide, a nitride, and/or an oxynitride, for example, a silicon oxide, a silicon nitride, a silicon oxynitride, or a combination thereof, but is not limited thereto. The gate insulating layer 15 may be one layer or at least two layers.

The interlayer insulating film 17 may include an organic material, an inorganic material, or an organic-inorganic material, and for example, an oxide, a nitride, or an oxynitride, for example, a silicon oxide, a silicon nitride, a silicon oxynitride, or a combination thereof, but is not limited thereto. The interlayer insulating film 17 may be one layer or at least two layers. The gate insulating layer 15 and the interlayer insulating film 17 respectively have contact holes 17a and 17b exposing the crystalline oxide semiconductor layer 12B.

The source electrode 18 and the drain electrode 19 may be electrically connected to a doping region of the crystalline oxide semiconductor layer 12B through the contact holes 17a and 17b. The source electrode 18 and the drain electrode 19 face each other with the crystalline oxide semiconductor layer 12B therebetween, and may be electrically connected to the crystalline oxide semiconductor layer 12B. The source electrode 18 is electrically connected to a data line (not shown) transferring data signals, and the drain electrode 19 may be an island type. The source electrode 18 and the drain electrode 19 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

The passivation layer 20 is disposed on the source electrode 18 and the drain electrode 19, and may protect and planarize the thin film transistor 100. The passivation layer 20 may include an organic material, an inorganic material, and/or an organic-inorganic material, and for example, an oxide, a nitride, and/or an oxynitride, for example, a silicon oxide, a silicon nitride, a silicon oxynitride, or a combination thereof, but is not limited thereto. The passivation layer 20 may be one layer or at least two layers.

The aforementioned thin film transistor 100 includes the crystalline oxide semiconductor layer 12B formed by the aforementioned process as an active layer and thus may have high charge mobility.

A method of manufacturing the aforementioned thin film transistor 100 may include, for example: forming a crystalline oxide semiconductor layer 12B by the crystallization method; forming a gate electrode 16 that is at least partially overlapped with the crystalline oxide semiconductor layer 12B; forming a gate insulating layer 15 between the crystalline oxide semiconductor layer 12B and the gate electrode 16; forming a source electrode 18 and a drain electrode 19 electrically connected to the crystalline oxide semiconductor layer 12B; and forming a passivation layer 20 on the source electrode 18 and the drain electrode 19.

Specifically, the method of manufacturing the aforementioned thin film transistor 100 may include, for example: forming a buffer layer 11 on the substrate 10; forming an amorphous oxide semiconductor layer 12A; optionally forming a capping layer 14; forming a crystallization auxiliary layer 13; annealing the crystallization auxiliary layer 13 to crystallize the amorphous oxide semiconductor layer 12A and to form a crystalline oxide semiconductor layer 12B; removing the crystallization auxiliary layer 13 and optionally the capping layer 14; forming a gate insulating layer 15 on the crystalline oxide semiconductor layer 12B; forming a gate electrode 16 on the gate insulating layer 15; forming an interlayer insulating layer 17 on the gate electrode 16; forming an interlayer insulating film 17 on the gate electrode 16; forming contact holes 17a and 17b through the gate insulating layer 15 and the interlayer insulating film 17 to expose the crystalline oxide semiconductor layer 12B; and forming a source electrode 18 and a drain electrode 19 on the interlayer insulating film 17.

As another example, a method of manufacturing the aforementioned thin film transistor 100 may include, for example: forming a buffer layer 11 on the substrate 10; forming an amorphous oxide semiconductor layer 12A; annealing the amorphous oxide semiconductor layer 12A to crystallize the amorphous oxide semiconductor layer 12A and to form a crystalline oxide semiconductor layer 12B; forming a gate insulating layer 15 on the crystalline oxide semiconductor layer 12B; forming a gate electrode 16 on the gate insulating layer 15; forming an interlayer insulating layer 17 on the gate electrode 16; forming contact holes 17a and 17b through the gate insulating layer 15 and the interlayer insulating film 17 to expose the crystalline oxide semiconductor layer 12B; and forming a source electrode 18 and a drain electrode 19 on the interlayer insulating film 17.

The forming the crystalline oxide semiconductor layer 12B is the same as described above.

The gate insulating layer 15 may be, for example, formed of an oxide, a nitride, an oxynitride, and/or an organic material through chemical vapor deposition (CVD). The gate insulating layer 15 may be formed as one layer or two more layers, and for example, an oxide layer formed of an oxide such as a silicon oxide and a nitride layer formed of a nitride such as a silicon nitride. In some cases, the capping layer 14 on the crystalline oxide semiconductor layer 12B may not be removed but may be used as the gate insulating layer 15.

The forming of the gate electrode 16 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, which is, for example, deposited through vapor deposition such as sputtering and then patterned.

The formation of the interlayer insulating film 17 may be, for example, formed of an oxide, a nitride, an oxynitride, and/or an organic material through the chemical vapor deposition (CVD). Subsequently, the gate insulating layer 15 and the interlayer insulating film 17 are patterned to form the contact holes 17a and 17b.

The source electrode 18 and the drain electrode 19 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, which is deposited, for example, through vapor deposition such as sputtering, and then patterned.

The passivation layer 20 may be formed on the source electrode 18 and the drain electrode 19 by chemical vapor deposition of, for example, an oxide, a nitride, an oxynitride, and/or an organic material. The passivation layer 20 may be formed of one layer or two or more layers, and may include, for example, an oxide layer made of an oxide such as a silicon oxide and a nitride layer made of a nitride such as a silicon nitride.

The aforementioned thin film transistor may be included in various display panels, for example, a liquid crystal display panel, an organic light emitting diode display panel, a quantum dot display panel, or a perovskite display panel.

The aforementioned thin film transistor or display panel may be included in various electronic devices, and for example, may be included in a display device or a semiconductor device.

Hereinafter, the embodiments are illustrated in more detail with reference to examples. However, the following examples are for illustrative purposes and do not limit the scope of claims.

Formation of Crystalline Oxide Semiconductor I

Example 1

A silicon oxide ($SiO_2$) is deposited on a glass substrate through chemical vapor deposition (CVD) to form a 500 nm-thick buffer layer. Subsequently, an indium-gallium-zinc oxide is deposited on the buffer layer through RF sputtering to form a 50 nm-thick amorphous indium-gallium-zinc oxide (amorphous In—Ga—Zn oxide, IGZO) semiconductor layer. Then, amorphous silicon (a-Si) is deposited on the amorphous IGZO semiconductor layer through chemical vapor deposition to form a 200 nm-thick crystallization auxiliary layer. Then, blue diode laser annealing is performed on the crystallization auxiliary layer according to the conditions shown in Table 1 to crystallize the amorphous IGZO semiconductor layer and thus form a crystalline oxide semiconductor layer. Then, the crystalline oxide semiconductor layer is annealed under an oxygen (02) atmosphere at about 450° C.

TABLE 1

| | |
|---|---|
| Beam size ($\mu m^2$) | 520 × 20 |
| Laser wavelength (nm) | 445 |
| Laser output (W) | 5.0 to 11.44 |
| Output density ($kW/cm^2$) | 110 |
| Scan rate (mm/s) | 400 |
| Si fusion time ($\mu s$) | 50 |

Example 2

A crystalline oxide semiconductor is formed according to the same method as Example 1 except that a 100 nm-thick amorphous IGZO semiconductor layer is formed instead of the 50 nm-thick amorphous IGZO semiconductor layer.

Evaluation I

When the blue diode laser annealing is performed in Examples 1 and 2, surface temperatures of the crystallization auxiliary layers are measured using an IR sensor (Tradename: CT video 2NH1, Manufacturer: Optris Infrared Sensing, LLC (Germany)).

The results are shown in Table 2.

TABLE 2

| | Surface temperature of crystallization auxiliary layer (° C.) |
|---|---|
| Example 1 | 812 |
| Example 2 | 1044 |

Evaluation II

Crystallinity of the crystalline oxide semiconductors according to Examples 1 and 2 are examined.

Figure 5:
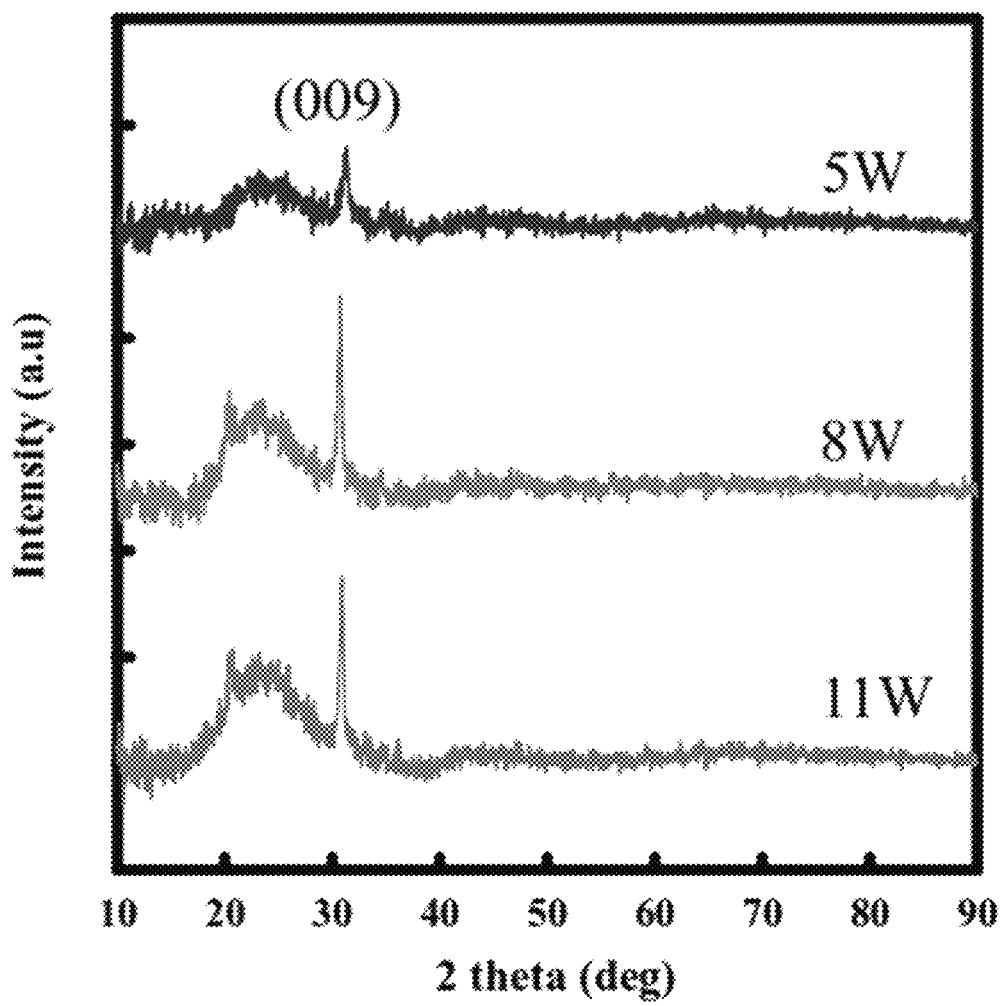
FIG. 5 is an XRD spectrum of the crystalline oxide semiconductor according to Example 1.
Figure 6:
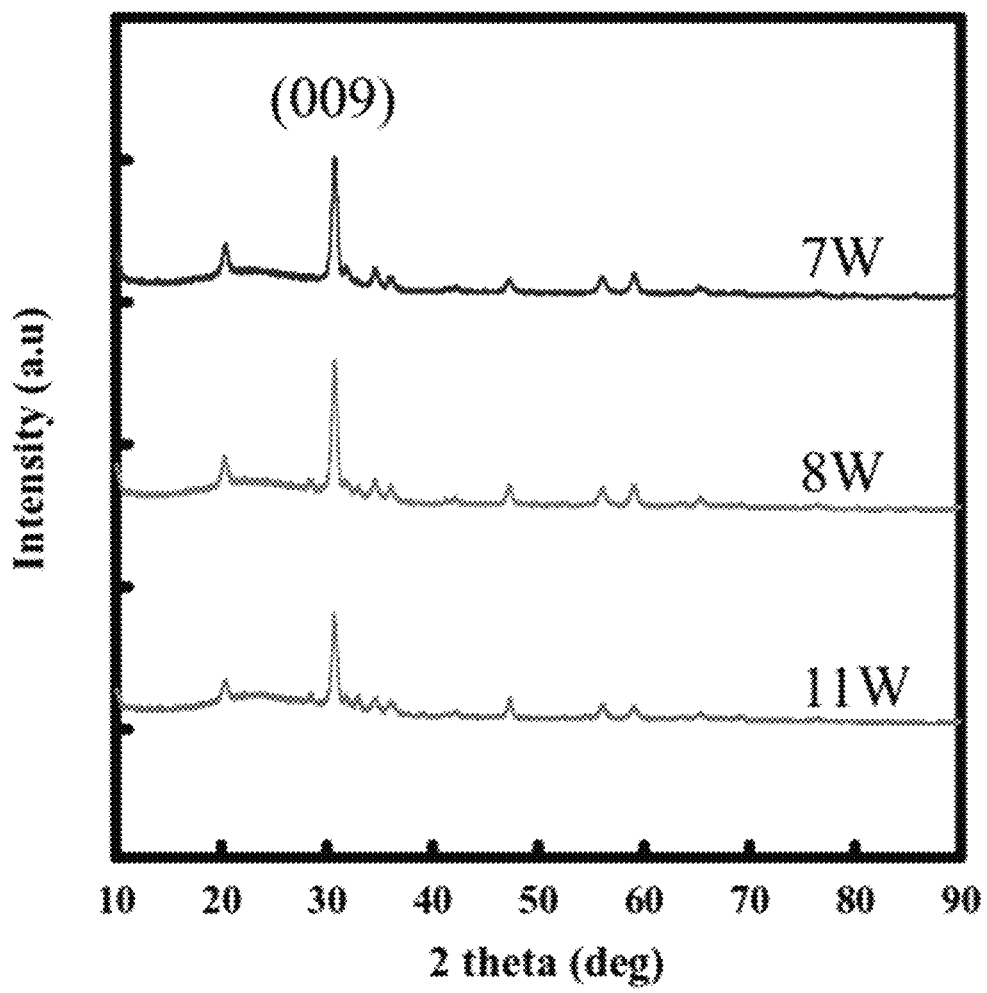
FIG. 6 is an XRD spectrum of a crystalline oxide semiconductor according to Example 2.
Figure 7:
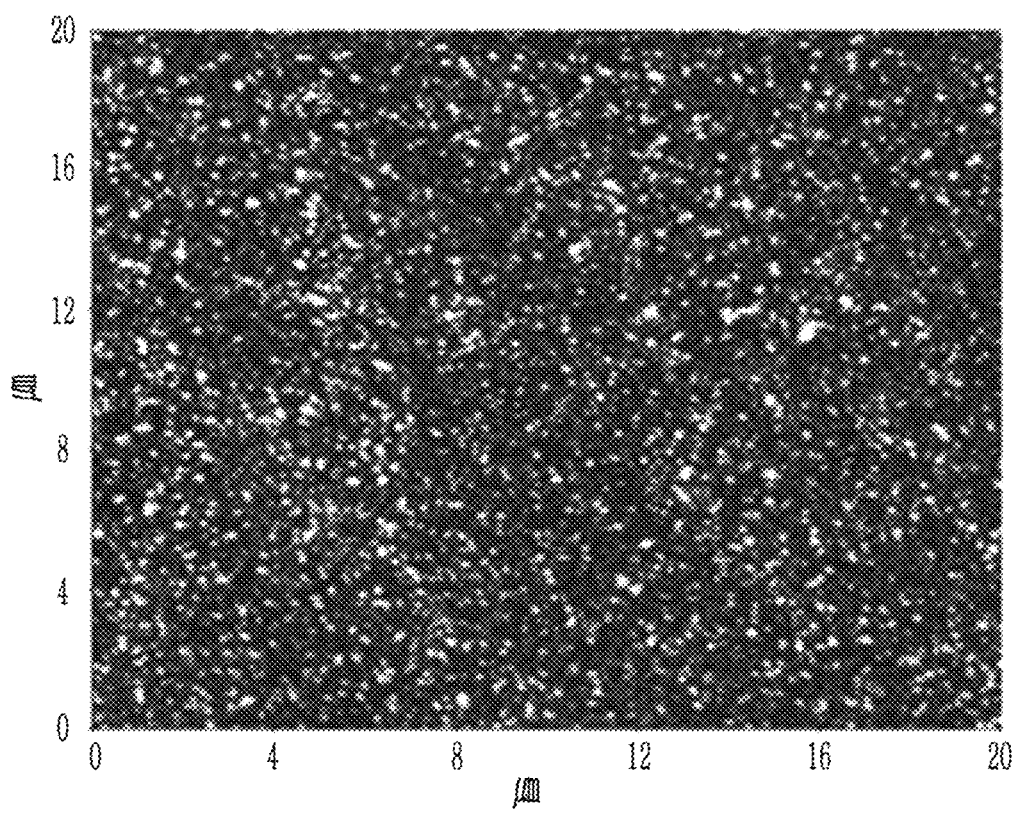
FIG. 7 is an atomic force microscope (AFM) photograph of the crystalline oxide semiconductor layer according to Example 1.
Figure 8:
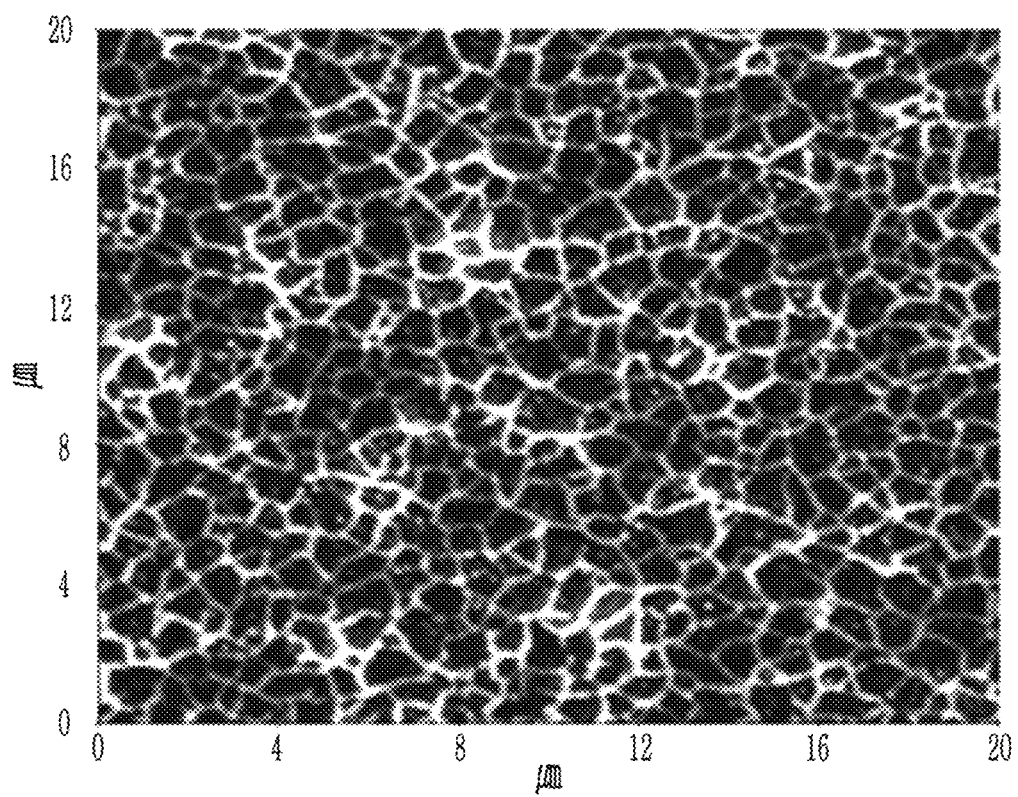
FIG. 8 is an AFM photograph of a crystalline oxide semiconductor layer according to Example 2.

FIG. 5 is an XRD spectrum of the crystalline oxide semiconductor layer according to Example 1, FIG. 6 is an XRD spectrum of a crystalline oxide semiconductor layer according to Example 2, FIG. 7 is an atomic force microscope (AFM) photograph of the crystalline oxide semiconductor layer according to Example 1, and FIG. 8 is an AFM photograph of a crystalline oxide semiconductor layer according to Example 2.

Referring to FIGS. 5 and 6, XRD spectra of the crystalline oxide semiconductor layers according to Examples 1 and 2 exhibit a (009) diffraction peak (2θ≈around about 31°). Accordingly, it is confirmed that the crystalline oxide semiconductor layers according to Examples 1 and 2 have crystals having c-axis oriented crystal planes.

Referring to FIGS. 7 and 8, the crystalline oxide semiconductor layers according to Examples 1 and 2 have grains with a predetermined size.

Formation of Crystalline Oxide Semiconductor II

Example 3

A silicon oxide is deposited on a glass substrate through the chemical vapor deposition (CVD) to form a 500 nm-thick buffer layer. Subsequently, an indium-gallium-zinc oxide (IGZO) is deposited on the buffer layer through RF sputtering to form a 25 nm-thick amorphous IGZO semiconductor layer. Subsequently, a silicon oxide is deposited on the amorphous IGZO semiconductor layer through chemical vapor deposition to form a 50 nm-thick capping layer. Then, amorphous silicon (a-Si) is deposited on the capping layer through chemical vapor deposition to form a 50 nm-thick crystallization auxiliary layer. Then, blue diode laser annealing is performed on the crystallization auxiliary layer according to the conditions of Table 1 to crystallize the amorphous IGZO semiconductor layer and thus form a crystalline oxide semiconductor layer. The crystalline oxide semiconductor layer is then annealed at about 450° C. under an oxygen (O2) atmosphere.

Example 4

A crystalline oxide semiconductor layer is formed according to the same method as Example 3 except that a 50 nm-thick amorphous IGZO semiconductor layer is formed instead of the 25 nm-thick amorphous IGZO semiconductor layer.

Example 5

A crystalline oxide semiconductor layer is formed according to the same method as Example 3 except that a 75 nm-thick amorphous IGZO semiconductor layer is formed instead of the 25 nm-thick amorphous IGZO semiconductor layer.

Example 6

A crystalline oxide semiconductor layer is formed according to the same method as Example 3 except that a 100 nm-thick amorphous IGZO semiconductor layer is formed instead of the 25 nm-thick amorphous IGZO semiconductor layer.

Example 7

A crystalline oxide semiconductor layer is formed according to the same method as Example 3 except that a 100 nm-thick crystallization auxiliary layer is formed instead of the 50 nm-thick crystallization auxiliary layer, and a 50 nm-thick amorphous IGZO semiconductor layer is formed instead of the 25 nm-thick amorphous IGZO semiconductor layer.

Example 8

A crystalline oxide semiconductor layer is formed according to the same method as Example 3 except that a 100 nm-thick crystallization auxiliary layer is formed instead of the 50 nm-thick crystallization auxiliary layer, and a 75 nm-thick amorphous IGZO semiconductor layer is formed instead of the 25 nm-thick amorphous IGZO semiconductor layer.

Evaluation III

When the blue diode laser annealing is performed in Example 7, a surface temperature change of the crystallization auxiliary layer according to a laser output is evaluated.

The surface temperatures of the crystallization auxiliary layers are measured by using an IR sensor.

Figure 9:
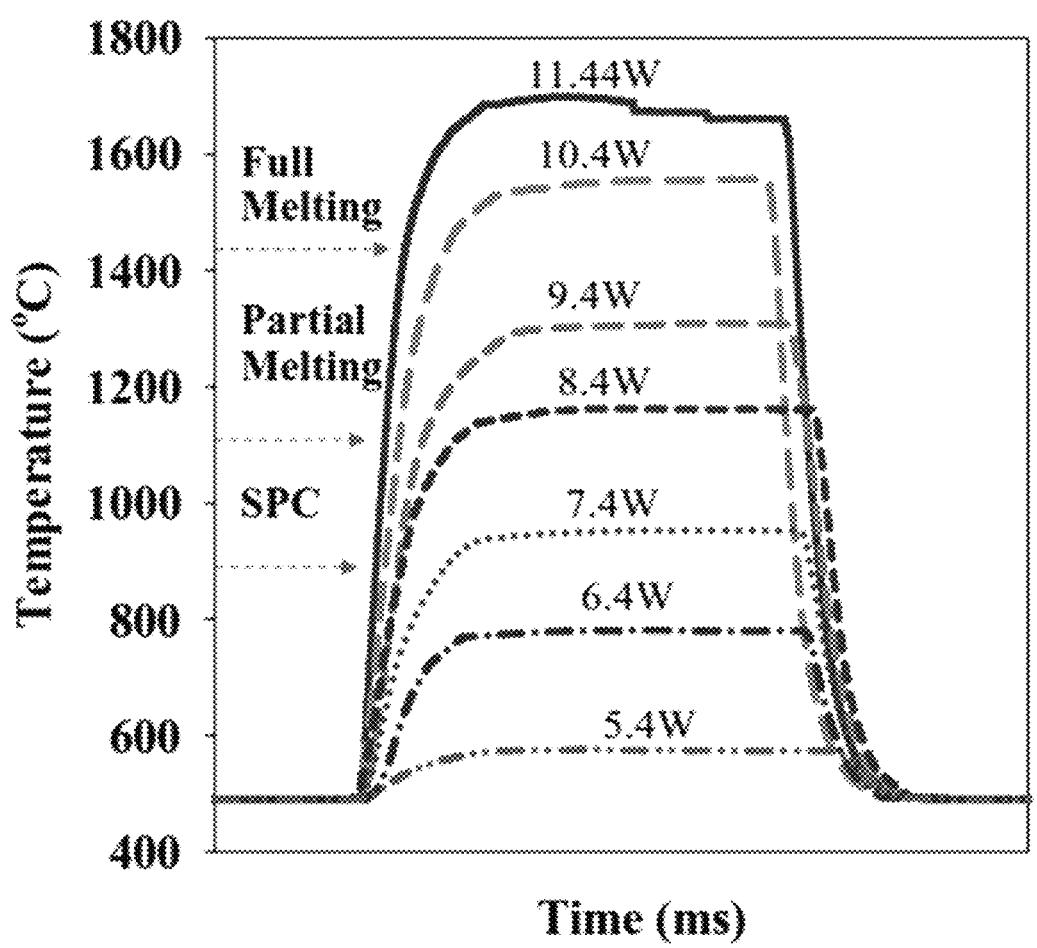
FIGS. 9 to 11 are graphs showing the change in the surface temperature of the crystallization auxiliary layer according to the laser output when performing blue diode laser annealing in Example 7.
Figure 10:
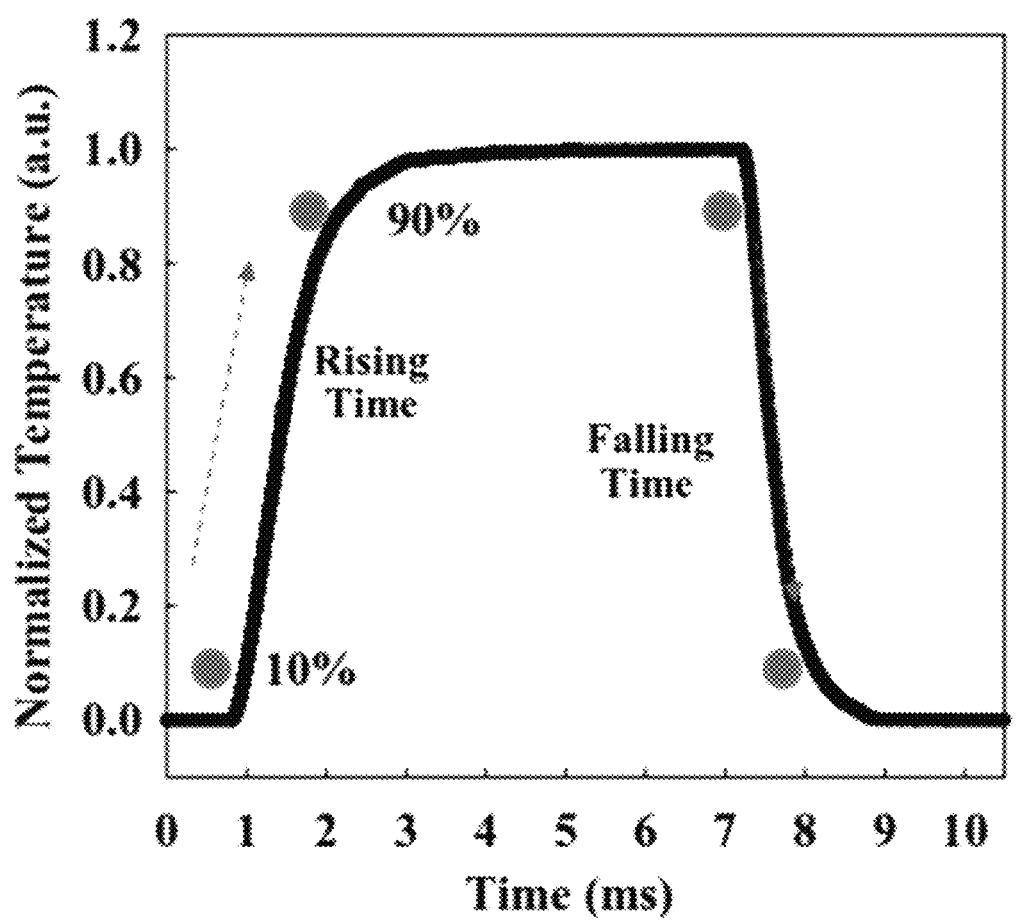
Figure 11:
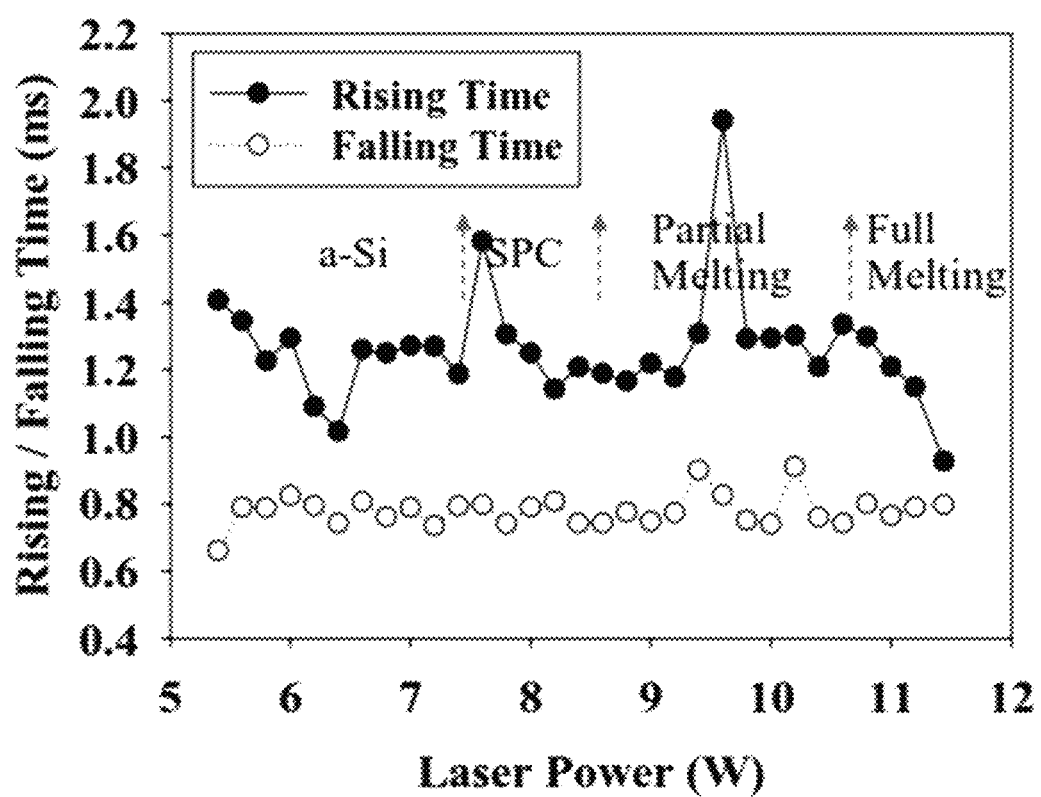

The results are shown in FIGS. 9 to 11 and Table 3.

FIGS. 9 to 11 are graphs showing the surface temperature change of the crystallization auxiliary layer according to a laser output, when the blue diode laser annealing is performed in Example 7.

TABLE 3

| Laser output (W) | Surface temperature of crystallization auxiliary layer (° C.) |
| --- | --- |
| 5.2 | 490 |
| 5.4 | 574.2 |

TABLE 3-continued

| Laser output (W) | Surface temperature of crystallization auxiliary layer (° C.) |
| --- | --- |
| 6.4 | 779.8 |
| 7.4 | 952.3 |
| 8.4 | 1162 |
| 9.4 | 1306 |
| 10.4 | 1555 |
| 11.44 | 1668 |

Referring to FIGS. 9 to 11 and Table 3, as the laser output is higher, the surface temperatures of the crystallization auxiliary layers are higher. Accordingly, as the laser output is higher, the more energy may be absorbed by the crystallization auxiliary layers and converted into higher thermal energy. In addition, the temperature turns out to rise and cool in a very short time (ms).

Evaluation IV

In Examples 3 to 6, thicknesses of the amorphous IGZO semiconductor layers and surface temperature changes of the crystallization auxiliary layers according to a laser output are evaluated.

Figure 12:
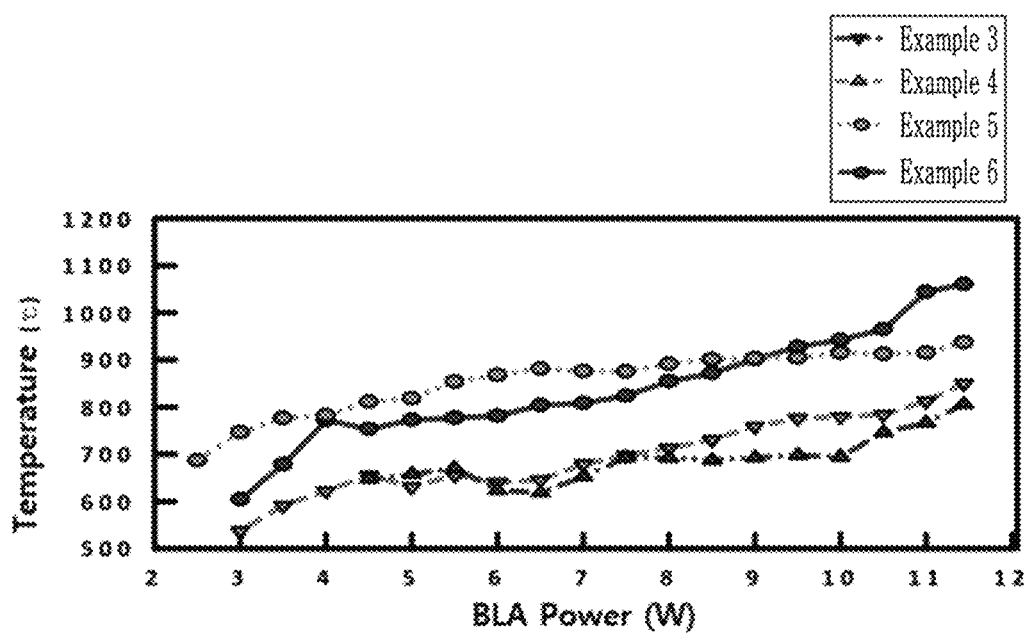
FIG. 12 is a graph showing the temperature change of the crystallization auxiliary layer according to the thickness of the amorphous oxide semiconductor layer and the laser power in Examples 3 to 6.

The results are shown in FIG. 12 and Table 4.

FIG. 12 is a graph showing thickness changes of the amorphous IGZO oxide semiconductor layers and temperature changes of the crystallization auxiliary layers according to a laser output in Examples 3 to 6.

TABLE 4

| Laser output (W) | Surface temperature (° C.) of crystallization auxiliary layer | | | |
| --- | --- | --- | --- | --- |
| | Example 3 | Example 4 | Example 5 | Example 6 |
| 6.0 | 623 | 640 | 867 | 781 |
| 6.5 | 618 | 645 | 881 | 803 |
| 7.0 | 652 | 678 | 875 | 808 |
| 7.5 | 692 | 697 | 875 | 824 |
| 8.0 | 692 | 712 | 891 | 854 |
| 8.5 | 687 | 731 | 901 | 871 |
| 9.0 | 692 | 758 | 903 | 901 |
| 9.5 | 697 | 776 | 904 | 927 |
| 10.0 | 694 | 779 | 915 | 942 |
| 10.5 | 746 | 780 | 912 | 964 |
| 11.0 | 766 | 812 | 915 | 1044 |
| 11.44 | 806 | 850 | 937 | 1061 |

Referring to FIG. 12 and Table 4, a temperature of a crystallization auxiliary layer may be changed according to a thickness of an amorphous IGZO semiconductor layer and a laser output.

Evaluation V

In Examples 3 to 8, thicknesses of the amorphous IGZO semiconductor layers and the crystallization auxiliary layers and crystallization according to a laser output are evaluated.

The results are shown in FIGS. 13 to 18 and Table 5.

Figure 13:
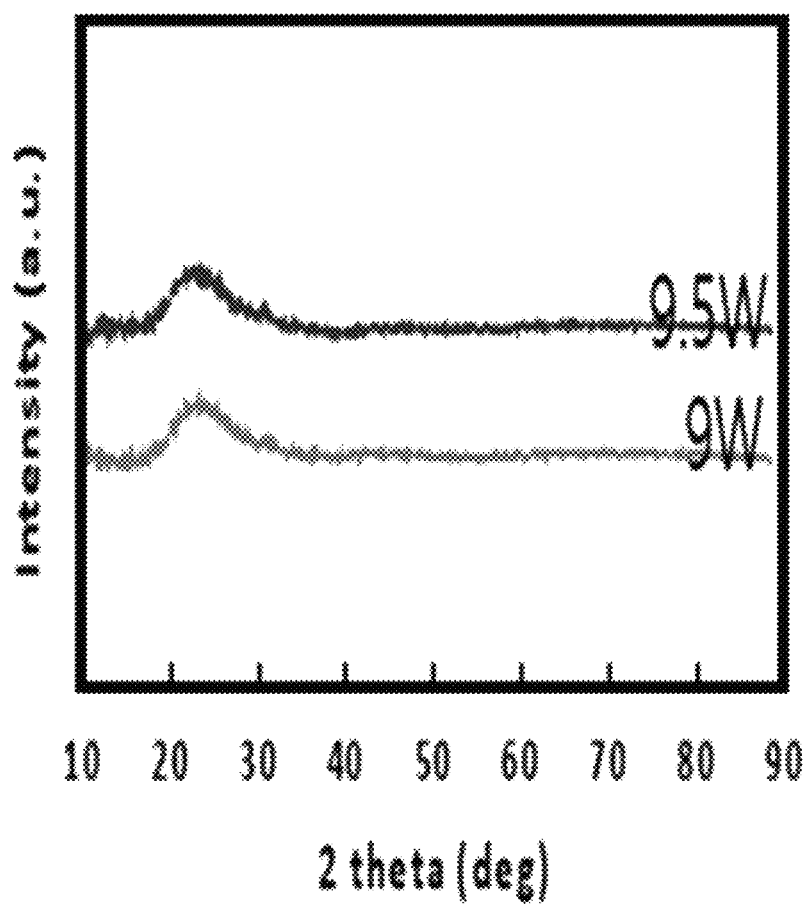
FIG. 13 is an XRD graph of a crystalline oxide semiconductor layer according to Example 3.
Figure 14:
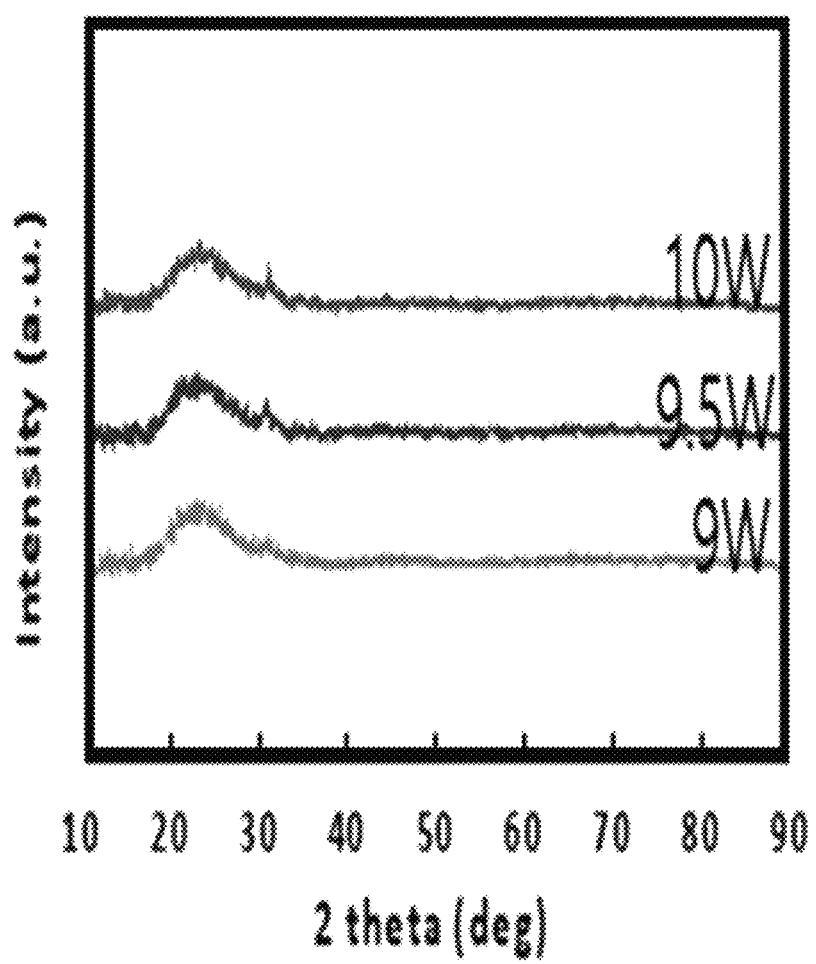
FIG. 14 is an XRD graph of a crystalline oxide semiconductor layer according to Example 4.
Figure 15:
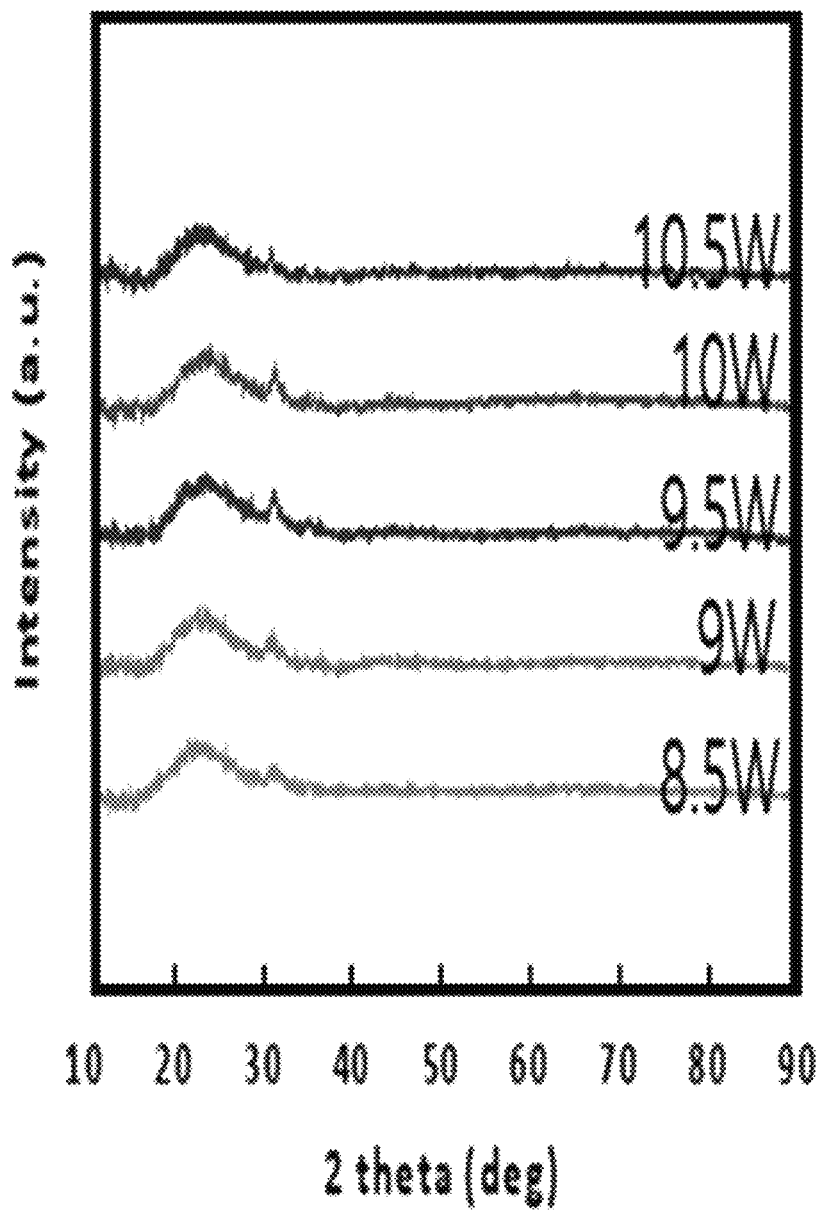
FIG. 15 is an XRD graph of a crystalline oxide semiconductor layer according to Example 5.
Figure 16:
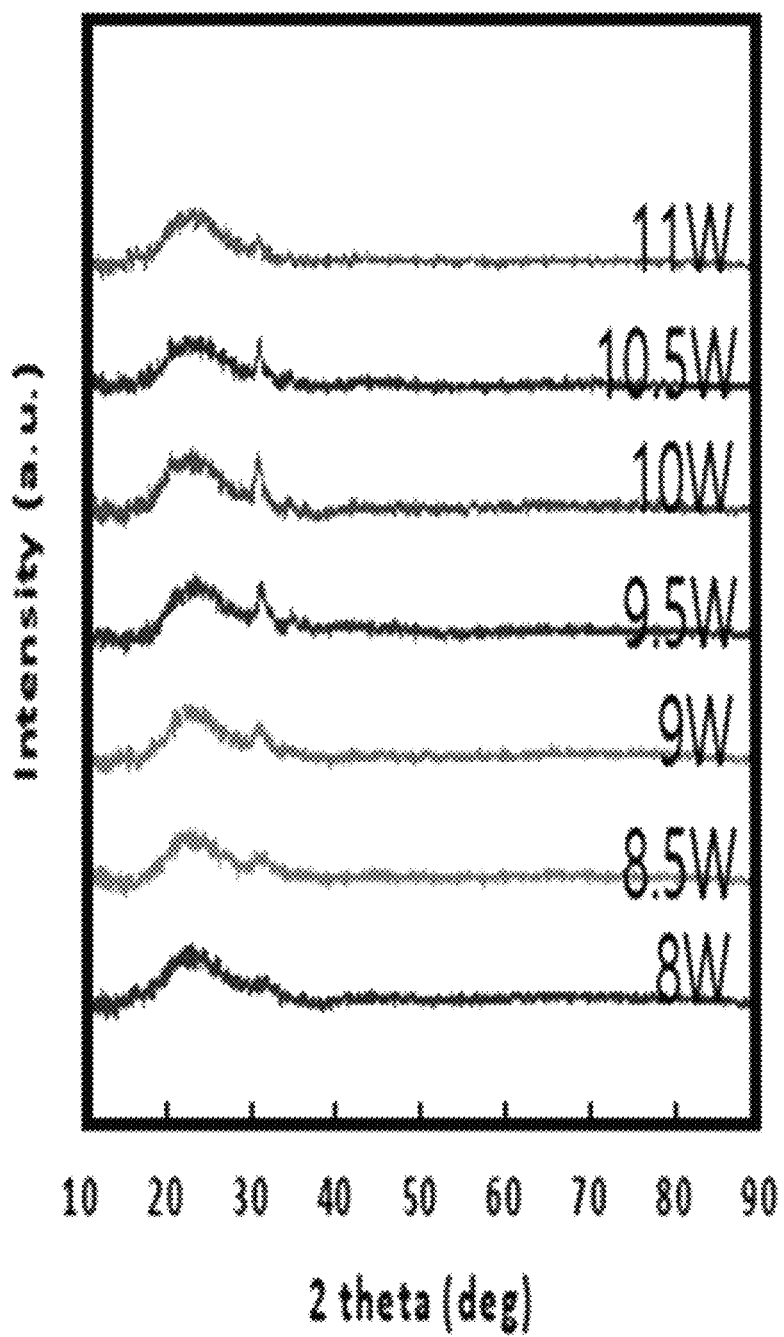
FIG. 16 is an XRD graph of a crystalline oxide semiconductor layer according to Example 6.
Figure 17:
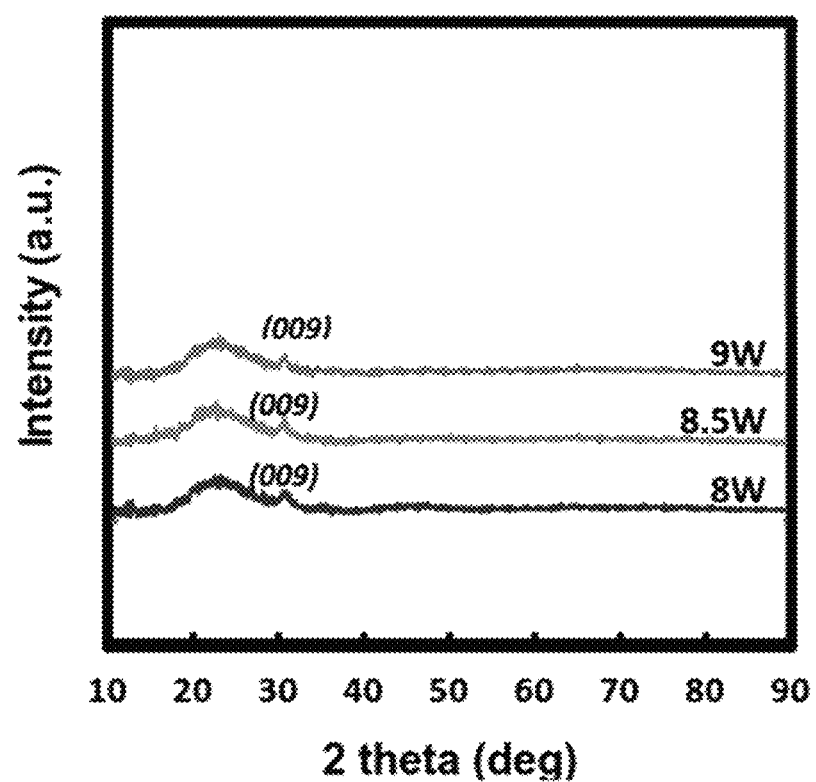
FIG. 17 is an XRD graph of a crystalline oxide semiconductor layer according to Example 7.
Figure 18:
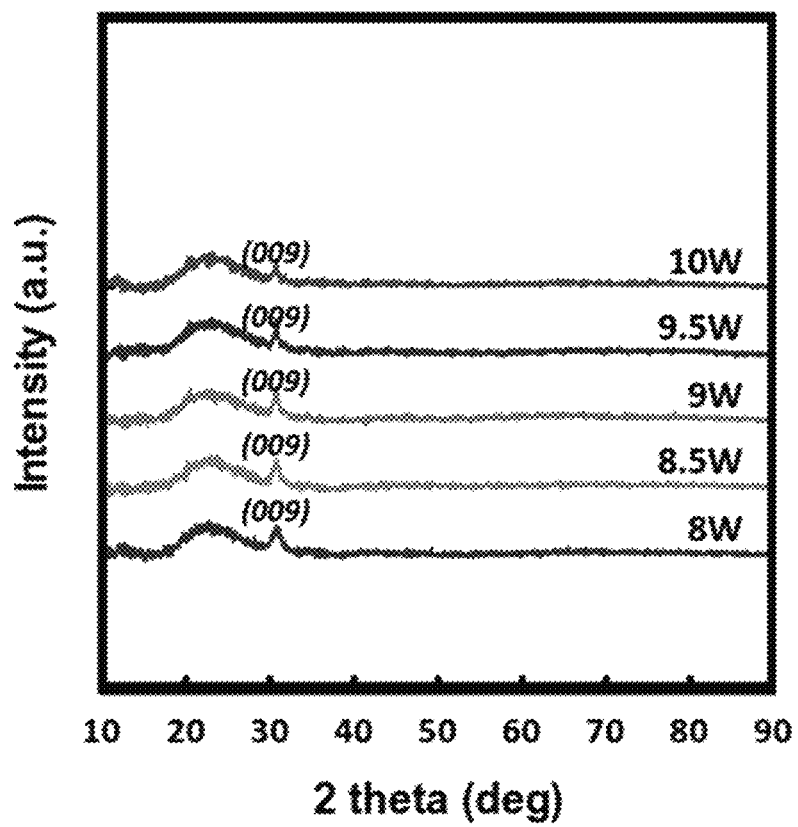
FIG. 18 is an XRD graph of a crystalline oxide semiconductor layer according to Example 8.

FIG. 13 is an XRD graph of the crystalline oxide semiconductor layer according to Example 3, FIG. 14 is an XRD graph of the crystalline oxide semiconductor layer according to Example 4, FIG. 15 is an XRD graph of the crystalline oxide semiconductor layer according to Example 5, FIG. 16 is an XRD graph of the crystalline oxide semiconductor layer according to Example 6, FIG. 17 is an XRD graph of the crystalline oxide semiconductor layer according to Example 7, and FIG. 18 is an XRD graph of the crystalline oxide semiconductor layer according to Example 8.

TABLE 5

| | Thickness of Amorphous Oxide Semiconductor Layer (nm) | Thickness of Crystallization Auxiliary Layer (nm) | Laser Output (W) | Peak Intensity (a.u.) |
|---|---|---|---|---|
| Example 4 | 50 | 50 | 9 | 123 |
| | | | 9.5 | 140 |
| | | | 10 | 130 |
| Example 5 | 75 | 50 | 8.5 | 116 |
| | | | 9 | 148 |
| | | | 9.5 | 178 |
| | | | 10 | 168 |
| | | | 10.5 | 122 |
| Example 7 | 50 | 100 | 8 | 150 |
| | | | 8.5 | 195 |
| | | | 9 | 144 |
| Example 8 | 75 | 100 | 8 | 218 |
| | | | 8.5 | 211 |
| | | | 9 | 238 |
| | | | 9.5 | 269 |
| | | | 10 | 187 |

* Peak Intensity: XRD (009) Peak Intensity

Referring to FIGS. 13 to 18, the crystalline oxide semiconductor layers according to Examples 3 to 8 exhibit a (009) diffraction peak (2θ around about 31°). In addition, it is confirmed that optimal annealing conditions exhibiting a (009) diffraction peak (2θ around about 31°) may be different according to thicknesses of the amorphous IGZO semiconductor layer and the crystallization auxiliary layer.

Evaluation VI

The crystalline oxide semiconductors according to Examples 7 and 8 are evaluated with respect to surface morphology according to a laser output.

Surface morphology is evaluated by atomic force microscopy (AFM).

The results are shown in Table 6.

TABLE 6

| | Example 7 | | | Example 8 | | | |
|---|---|---|---|---|---|---|---|
| Laser output (W) | 8 W | 8.5 W | 9 W | 8 W | 9 W | 9.5 W | 10 W |
| $R_a$ (nm) | 0.7 | 0.7 | 0.9 | 0.7 | 0.6 | 0.7 | 0.7 |
| $R_{pv}$ (nm) | 8.90 | 13.6 | 15.8 | 9.8 | 17.4 | 8.1 | 7.5 |

* $R_a$: Average Surface Roughness,
* $R_{pv}$: Surface Roughness root mean square Referring to Table 6, the crystalline oxide semiconductors according to Examples 7 and 8 turn out to have satisfactory surface morphology.

Evaluation VII

Electrical properties of the crystalline oxide semiconductors according to Examples 7 and 8 depending on the number of laser outputs are evaluated.

The electrical properties are evaluated from the Hall effect results.

The results are shown in Table 7.

TABLE 7

| | Example 7 | | | Example 8 | | | |
|---|---|---|---|---|---|---|---|
| Laser output (W) | 8 W | 8.5 W | 9 W | 8 W | 9 W | 9.5 W | 10 W |
| Hall mobility (cm²/Vs) | 6.69 | 7.56 | 2.4 | 6.0 | 8.9 | 4.8 | 2.0 |

Referring to Table 7, the crystalline oxide semiconductors according to Examples 7 and 8 exhibit satisfactory electrical properties, wherein the electrical properties vary according to a crystallization condition (laser output).

Formation of Crystalline Oxide Semiconductor III

Example 9

On a glass substrate, a silicon oxide is deposited on a glass substrate through chemical vapor deposition (CVD) to form a 500 nm-thick buffer layer. Subsequently, indium-gallium-tin oxide (IGTO) is deposited on the buffer layer through RF sputtering to form a 100 nm-thick amorphous IGTO semiconductor layer. Then, a silicon oxide is deposited on the amorphous IGTO semiconductor layer through the chemical vapor deposition (CVD) to form a 50 nm-thick capping layer. Subsequently, an amorphous silicon (a-Si) is deposited on the capping layer through the chemical vapor deposition (CVD) to form a 50 nm-thick crystallization auxiliary layer. Subsequently, 1 shot to 15 shots of blue diode laser annealing is performed on the crystallization auxiliary layer with a laser output of 7 W to crystallize the amorphous IGTO semiconductor layer and thus form a crystalline oxide semiconductor layer. The crystalline oxide semiconductor layer is annealed at about 450° C. under an oxygen (O2) atmosphere.

Example 10

A crystalline oxide semiconductor layer is formed according to the same method as Example 9, except that a 100 nm-thick crystallization auxiliary layer instead of the 50 nm-thick crystallization auxiliary layer is formed through 1 shot to 15 shots of blue diode laser annealing with a laser output of 7.2 W.

Evaluation VIII

Crystallinity of the crystalline oxide semiconductor layers according to Examples 9 and 10 are examined.

Figure 19:
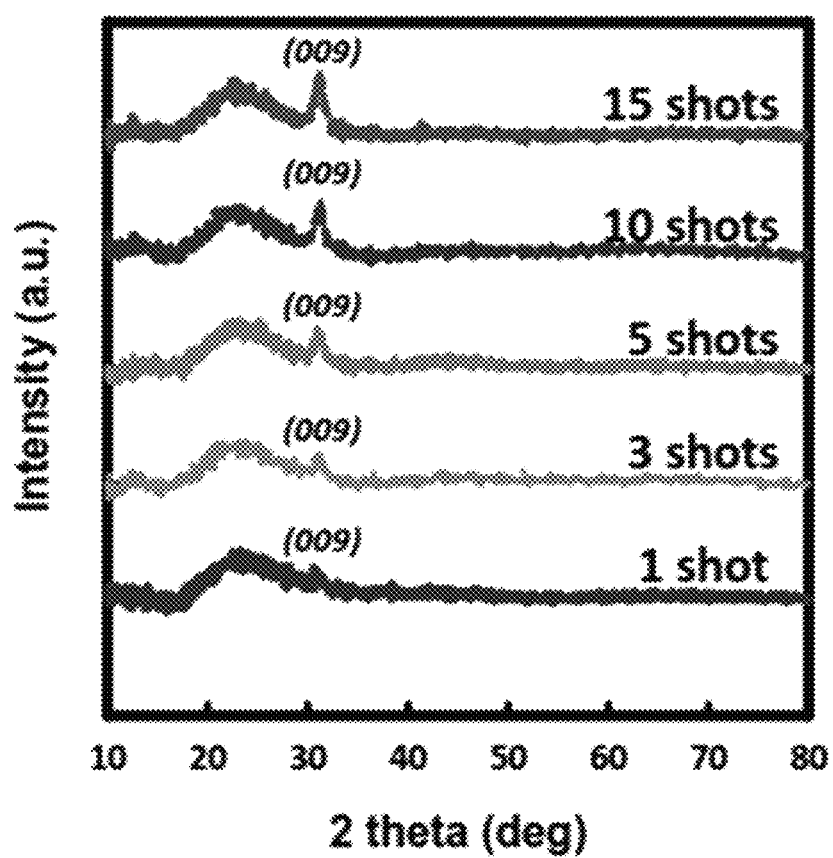
FIG. 19 is an XRD graph of a crystalline oxide semiconductor layer according to Example 9.
Figure 20:
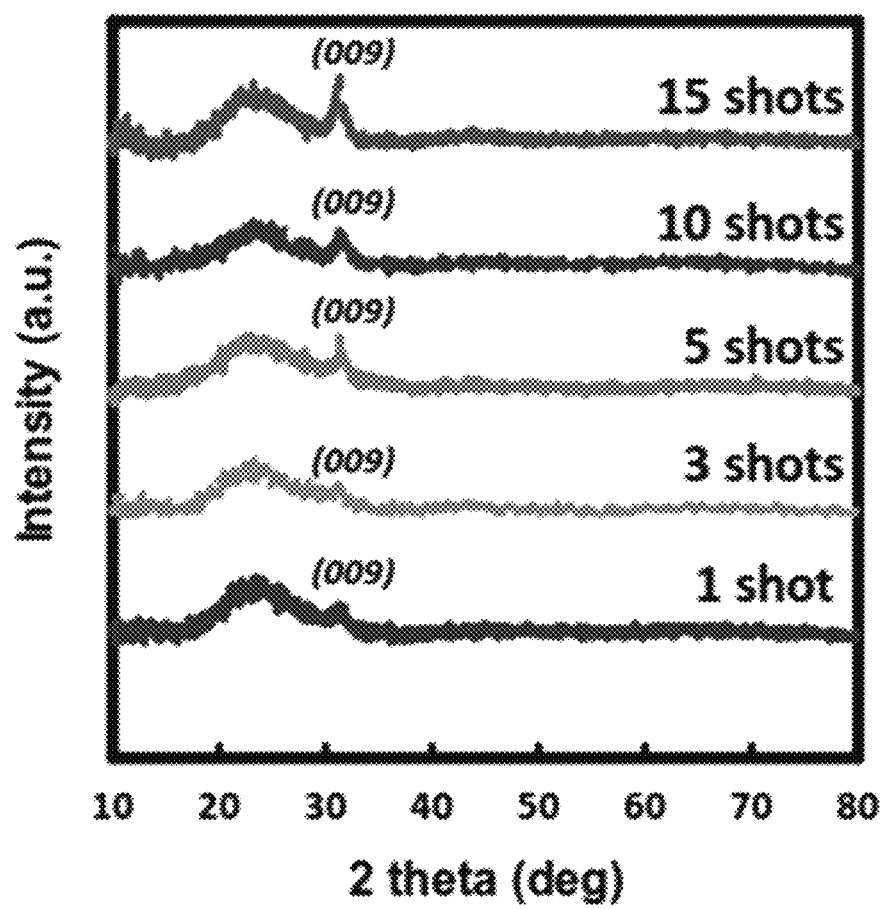
FIG. 20 is an XRD graph of a crystalline oxide semiconductor layer according to Example 10.
Figure 21:
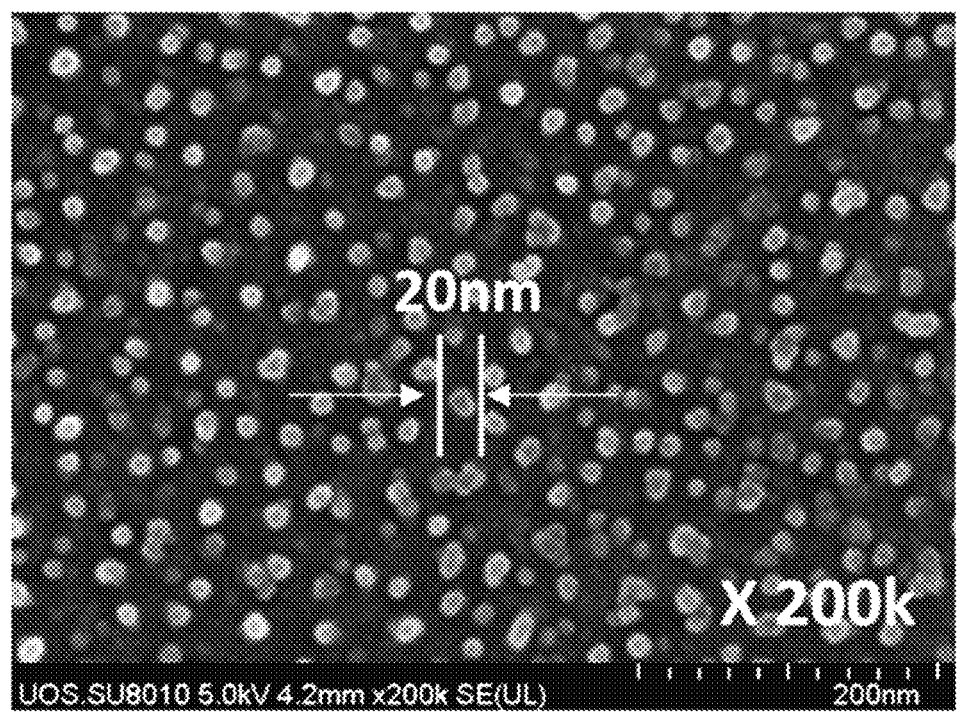
FIG. 21 is a scanning electron microscope (SEM) photograph of a crystalline oxide semiconductor layer according to Example 9.

FIG. 19 is an XRD graph of a crystalline oxide semiconductor layer according to Example 9, FIG. 20 is an XRD graph of a crystalline oxide semiconductor layer according to Example 10, and FIG. 21 is a scanning electron microscope (SEM) photograph of a crystalline oxide semiconductor layer according to Example 9.

Referring to FIGS. 19 to 21, the crystalline oxide semiconductor layers according to Examples 9 and 10 exhibit a (009) diffraction peak (2θ≈around about 31°) and have grains with a predetermined size. Accordingly, it is confirmed that the crystalline oxide semiconductors according to Examples 9 and 10 have crystals with a c-axis oriented crystal plane.

Evaluation IX

Electrical properties of the crystalline oxide semiconductor layers according to Examples 9 and 10 depending on the number of laser outputs are evaluated.

The results are shown in Tables 8 and 9.

TABLE 8

| | Example 9 | | | | |
|---|---|---|---|---|---|
| Number of laser scans (frequency) | 1 | 3 | 5 | 10 | 15 |
| Hall mobility (cm²/Vs) | 3.2 | 3.4 | 3.9 | 3.8 | 3.7 |

TABLE 9

|  | Example 10 | | | | |
| --- | --- | --- | --- | --- | --- |
| Number of laser scans (frequency) | 1 | 3 | 5 | 10 | 15 |
| Hall mobility (cm²/Vs) | 4.4 | 5.6 | 6.2 | 6.6 | 2.7 |

Referring to Tables 8 and 9, it is confirmed that the crystalline oxide semiconductors according to Examples 9 and 10 exhibit sufficient electrical properties, and annealing conditions exhibiting optimal electrical properties are different from each other.

Formation of Crystalline Oxide Semiconductor IV

Example 11

A silicon oxide is deposited on a glass substrate through the chemical vapor deposition (CVD) to form a 500 nm-thick buffer layer. Subsequently, indium-gallium-zinc oxide (IGZO) is deposited on the buffer layer through RF sputtering to form a 50 nm-thick amorphous IGZO semiconductor layer. Then, a silicon oxide is deposited on the amorphous IGZO semiconductor layer through the chemical vapor deposition (CVD) to form a 50 nm-thick capping layer. Subsequently, amorphous silicon (a-Si) is deposited on the capping layer through the chemical vapor deposition (CVD) to form a 50 nm-thick crystallization auxiliary layer. Subsequently, excimer laser annealing is performed on the crystallization auxiliary layer with an excimer laser (wavelength: 308 nm, energy: 480 to 500 mJ) to crystallize the amorphous IGZO semiconductor layer and thus form a crystalline oxide semiconductor layer. The crystalline oxide semiconductor layer is annealed under an oxygen ($O_2$) atmosphere at about 450° C.

Example 12

A crystalline oxide semiconductor layer is formed according to the same method as Example 11 except that a 75 nm-thick amorphous IGZO semiconductor layer is formed instead of the 50 nm-thick amorphous IGZO semiconductor layer.

Evaluation X The crystalline oxide semiconductor layers of Examples 11 and 12 are examined with respect to crystallinity.

Figure 22:
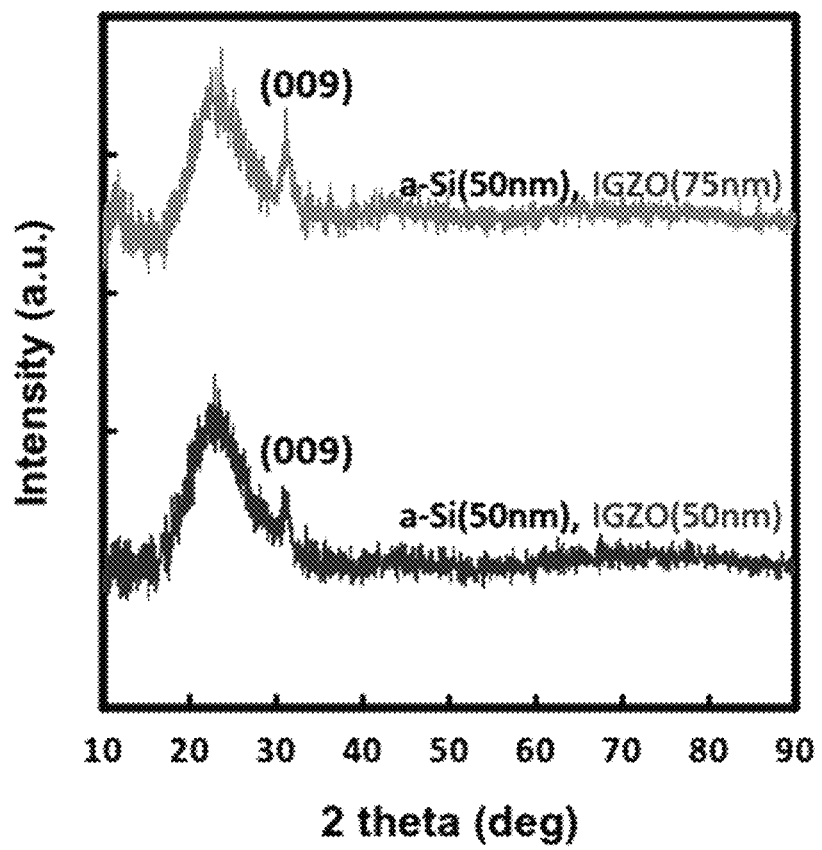
FIG. 22 is an XRD graph of a crystalline oxide semiconductor layer according to Examples 11 and 12.

FIG. 22 is an XRD graph of the crystalline oxide semiconductor layers according to Examples 11 and 12.

Referring to FIG. 22, the crystalline oxide semiconductor layers according to Examples 11 and 12 exhibit a (009) diffraction peak (2θ≈around about 31°). Accordingly, it is confirmed that the crystalline oxide semiconductors according to Examples 11 and 12 turn out to have crystals with crystal planes arranged along a c-axis.

Evaluation XI

The crystalline oxide semiconductor of Example 11 is evaluated with respect to surface morphology.

The results are shown in Table 10.

TABLE 10

|  | $R_a$ (nm) | $Rp_v$ (nm) |
| --- | --- | --- |
| Example 11 | 1.73 | 13.37 |

\* $R_a$: Average Surface Roughness,
\* $Rp_v$: Surface Roughness root mean square Referring to Table 10, the crystalline oxide semiconductor of Example 11 turns out to have satisfactory surface morphology.

Evaluation XII

The crystalline oxide semiconductor of Example 11 is evaluated with respect to electrical properties.

The results are shown in Table 11.

TABLE 11

|  | Example 11 |
| --- | --- |
| Hall mobility (cm²/Vs) | 5.66 |

Referring to Table 11, the crystalline oxide semiconductor of Example 11 exhibits satisfactory electrical properties and also similar electrical properties to the above case of using the blue diode laser annealing.

Formation of Crystalline Oxide Semiconductor V

Example 13

A silicon oxide is deposited on a glass substrate through the chemical vapor deposition (CVD) to form a 200 nm-thick buffer layer. Subsequently, indium-gallium-zinc oxide (IGZO) is deposited on the buffer layer through RF sputtering to form a 50 nm-thick amorphous IGZO semiconductor layer. Subsequently, the amorphous IGZO semiconductor layer is annealed at 800° C. (rising time: 2 minutes) for 10 minutes or 30 minutes by using RTA equipment, forming a crystalline oxide semiconductor layer.

Example 14

A crystalline oxide semiconductor layer is formed according to the same method as Example 13 except that a 100 nm-thick amorphous IGZO semiconductor layer is formed instead of the 50 nm-thick amorphous IGZO semiconductor layer.

Evaluation XIII

The crystalline oxide semiconductor layers of Examples 13 and 14 are examined with respect to crystallinity.

Figure 23:
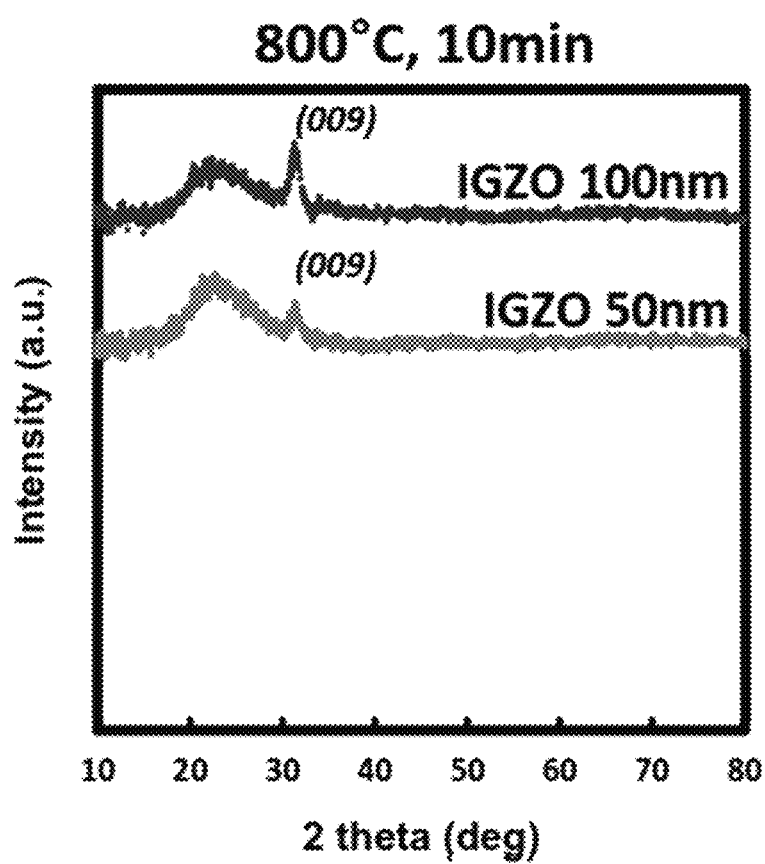
FIGS. 23 and 24 are XRD graphs according to annealing time of crystalline oxide semiconductor layers according to Examples 13 and 14.
Figure 24:
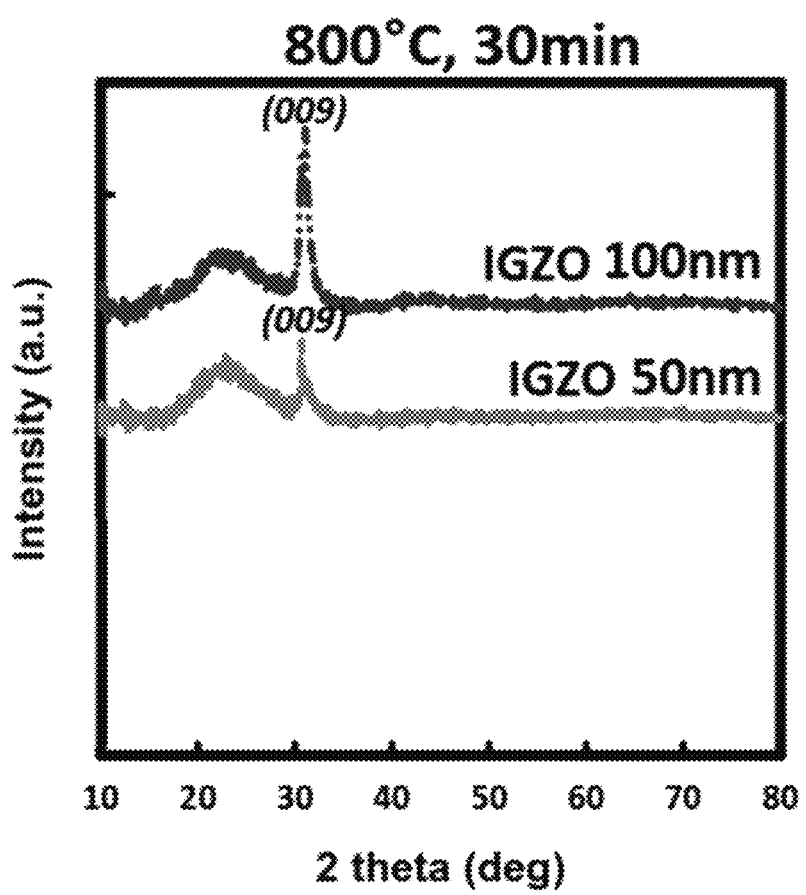

FIGS. 23 and 24 are XRD graphs of the crystalline oxide semiconductor layers of Examples 13 and 14 according to annealing time.

Referring to FIGS. 23 and 24, the crystalline oxide semiconductor layers of Examples 13 and 14 turn out to have a (009) diffraction peak (2θ≈around about 31°), which exhibits that crystal planes are arranged along a c-axis.

Evaluation XIV

The crystalline oxide semiconductor layers of Examples 13 and 14 are evaluated with respect to electrical properties.

The results are shown in Tables 12 and 13.

TABLE 12

|  | Example 13 (annealing time: 10 minutes) |
| --- | --- |
| Hall mobility (cm²/Vs) | 13.5 |

TABLE 13

|  | Example 14 | |
| --- | --- | --- |
| Annealing time | 10 minutes | 30 minutes |
| Hall mobility (cm²/Vs) | 13.4 | 11.8 |

Referring to Tables 12 and 13, the crystalline oxide semiconductor layers of Examples 13 and 14 exhibit satisfactory electrical properties.

Formation of Thin Film Transistor I

Example 15

A silicon oxide (SiO$_2$) is deposited on a glass substrate through the chemical vapor deposition (CVD) to form a 500 nm-thick buffer layer. Subsequently, indium-gallium-zinc oxide (IGZO) is deposited on the buffer layer through RF sputtering to form a 75 nm-thick amorphous IGZO semiconductor layer. Subsequently, a silicon oxide (SiO$_2$) is deposited on the amorphous IGZO semiconductor layer through the chemical vapor deposition (CVD) to form a 50 nm-thick capping layer. Subsequently, amorphous silicon (a-Si) is deposited on the capping layer through the chemical vapor deposition (CVD) to a 50 nm-thick crystallization auxiliary layer. Subsequently, blue diode laser annealing (output: 8 W) is performed on the crystallization auxiliary layer for 50 μs to crystallize the amorphous IGZO semiconductor layer and thus form a crystalline oxide semiconductor layer. Subsequently, dry etching is performed to remove the crystallization auxiliary layer and the capping layer. Subsequently, the crystalline oxide semiconductor layer is annealed under an oxygen (02) atmosphere at about 450° C. Then, the crystalline oxide semiconductor layer is patterned, forming an island-type crystalline oxide semiconductor layer. On the island-type crystalline oxide semiconductor layer, the 100 nm-thick silicon oxide (SiO$_2$) layer is deposited through the chemical vapor deposition (PECVD) to form a gate insulating layer. After patterning the gate insulating layer, both sides of the island-type crystalline oxide semiconductor layer are n+ doped to form doping regions. Subsequently, a 100 nm-thick molybdenum layer is sputtered on the gate insulating layer and then patterned to form a gate electrode. Then, a 300 nm-thick silicon oxide (SiO$_2$) layer is deposited on the gate electrode through the chemical vapor deposition (CVD) to form an interlayer insulating layer. Subsequently, the interlayer insulating layer is patterned to form contact holes exposing the doping region of the island-type crystalline oxide semiconductor layer. Then, a 200 nm-thick molybdenum layer is sputtered on the interlayer insulating layer and then patterned to form a source electrode and a drain electrode. Subsequently, a 300 nm-thick silicon oxide (SiO$_2$) layer is formed on the source electrode and the drain electrode through the chemical vapor deposition (CVD) to form a passivation layer, and then annealed under vacuum at 250° C. for 4 hours, manufacturing a thin film transistor. The thin film transistor has a channel length (L) of about 20 μm and a channel width (W) of about 40 μm.

Example 16

A thin film transistor is manufactured according to the same method as Example 15 except that a crystalline oxide semiconductor layer is formed through excimer laser annealing (495 mJ) instead of the blue diode laser annealing.

Evaluation XV

Electric field effect mobility ($\mu_{FE}$), sub-threshold voltage slopes (SS), and threshold voltages ($V_{th}$) of the thin film transistors according to Examples 15 and 16 are evaluated.

The results are shown in Table 14.

TABLE 14

|  | $\mu_{FE}$ (cm2/V · s) | SS (V/dec) | $V_{th}$ (V) |
| --- | --- | --- | --- |
| Example 15 | 10.2 | 0.25 | −1.1 |
| Example 16 | 4.29 | 0.37 | 0.8 |

Referring to Table 14, the thin film transistors of Examples 15 and 16 exhibit satisfactory electric field effect mobility ($\mu_{FE}$), sub-threshold voltage slope (SS), and threshold voltage ($V_{th}$).

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A crystallization process of an oxide semiconductor, comprising:
   forming an amorphous oxide semiconductor layer on a substrate,
   forming a crystallization auxiliary layer on the amorphous oxide semiconductor layer, the crystallization auxiliary layer including a light absorbing inorganic material, and
   annealing the crystallization auxiliary layer to crystallize the amorphous oxide semiconductor layer,
   wherein the light absorbing inorganic material comprises amorphous silicon.

2. The crystallization process of claim 1, wherein the annealing of the crystallization auxiliary layer comprises irradiating light.

3. The crystallization process of claim 2, wherein in the irradiating of the light, a light source irradiating light having a wavelength of less than about 500 nm is used.

4. The crystallization process of claim 1, wherein the annealing of the crystallization auxiliary layer is performed by laser annealing or heat treatment.

5. The crystallization process of claim 4, wherein
   the annealing of the crystallization auxiliary layer is performed by laser annealing, and
   the laser annealing is blue diode laser annealing or excimer laser annealing.

6. The crystallization process of claim 4, wherein the laser annealing is performed for about 50 μs or less.

7. The crystallization process of claim 4, wherein the laser annealing is performed with an output of about 5 W to about 15 W.

8. The crystallization process of claim 1, wherein in the annealing of the crystallization auxiliary layer, the highest surface temperature of the crystallization auxiliary layer is about 500° C. to about 1800° C.

9. The crystallization process of claim 1, wherein
   a thickness of the crystallization auxiliary layer is about 10 nm to about 500 nm, and
   a thickness of the amorphous oxide semiconductor layer is about 20 nm to about 200 nm.

10. The crystallization process of claim 9, wherein the thickness of the crystallization auxiliary layer is about 0.5 times to about 10 times the thickness of the amorphous oxide semiconductor layer.

11. The crystallization process of claim 1, further comprising annealing at a temperature of about 300° C. to about 600° C. in an oxygen atmosphere after the crystallization of the amorphous oxide semiconductor layer.

12. The crystallization process of claim 1, further comprising forming a capping layer between the forming of the amorphous oxide semiconductor layer and the forming of the crystallization auxiliary layer.

13. The crystallization process of claim 12, wherein the capping layer comprises an oxide, a nitride, an oxynitride, or a combination thereof including silicon, aluminum, or a combination thereof.

14. The crystallization process of claim 1, further comprising removing the crystallization auxiliary layer after the crystallization of the amorphous oxide semiconductor layer.

15. The crystallization process of claim 1, wherein a crystallized oxide semiconductor layer having a (009) diffraction peak in the XRD spectrum is obtained in the annealing of the crystallization auxiliary layer.

16. A crystalline oxide semiconductor obtained by the process of claim 1, wherein the crystalline oxide semiconductor exhibits a (009) diffraction peak in an XRD spectrum.

17. A thin film transistor, comprising
the crystalline oxide semiconductor layer, the crystalline oxide semiconductor layer including the crystalline oxide semiconductor of claim 16,
a gate electrode that is at least partially overlapped with the crystalline oxide semiconductor layer, and
a source electrode and a drain electrode electrically connected to the crystalline oxide semiconductor layer,
wherein the crystalline oxide semiconductor layer exhibits a (009) diffraction peak in an XRD spectrum.

18. A display panel comprising the thin film transistor of claim 17.

19. An electronic device comprising the thin film transistor of claim 17.

20. A method of manufacturing a thin film transistor, comprising:
crystallizing an oxide semiconductor according to the process of claim 1 to form a crystalline oxide semiconductor layer,
forming a gate electrode that is at least partially overlapped with the crystalline oxide semiconductor layer, and
forming a source electrode and a drain electrode electrically connected to the crystalline oxide semiconductor layer.

* * * * *